(12) United States Patent
Cai et al.

(10) Patent No.: US 10,199,965 B2
(45) Date of Patent: Feb. 5, 2019

(54) MAGNETIC SENSOR INTEGRATED CIRCUIT, MOTOR ASSEMBLY AND APPLICATION APPARATUS

(71) Applicant: Johnson Electric S.A., Murten (CH)

(72) Inventors: Guang Jie Cai, Hong Kong (CN);
Chun Fai Wong, Hong Kong (CN);
Yue Li, Hong Kong (CN); Chi Ping Sun, Hong Kong (CN); Bao Ting Liu, Shen Zhen (CN); En Hui Wang, Shen Zhen (CN); Fei Xin, Shen Zhen (CN); Shing Hin Yeung, Hong Kong (CN); Xiu Wen Yang, Shen Zhen (CN); Li Sheng Liu, Shen Zhen (CN); Yan Yun Cui, Shen Zhen (CN); Shu Juan Huang, Shen Zhen (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 0 days.

(21) Appl. No.: 15/230,975

(22) Filed: Aug. 8, 2016

(65) Prior Publication Data
US 2016/0344317 A1    Nov. 24, 2016

Related U.S. Application Data

(63) Continuation-in-part of application No. 14/822,353, filed on Aug. 10, 2015, now Pat. No. 9,755,555, and
(Continued)

(30) Foreign Application Priority Data

Aug. 8, 2014   (CN) .......................... 2014 1 0390592
Aug. 15, 2014  (CN) .......................... 2014 1 0404474
(Continued)

(51) Int. Cl.
*H02P 6/08*   (2016.01)
*H02P 6/14*   (2016.01)
(Continued)

(52) U.S. Cl.
CPC .............. *H02P 6/16* (2013.01); *G01R 33/072* (2013.01); *H02K 11/215* (2016.01); *H02P 6/20* (2013.01);
(Continued)

(58) Field of Classification Search
CPC .............. H02P 6/08; H02P 6/14; B62D 5/049
(Continued)

(56) References Cited

U.S. PATENT DOCUMENTS 4,832,576 A * 5/1989 Deguchi .................. H02P 6/08
                                                  310/63
5,659,230 A * 8/1997 Fukuoka .................. H02P 6/14
                                                  318/400.04
(Continued)

FOREIGN PATENT DOCUMENTS

CN    201409107 Y    2/2010
CN    201590796 U    9/2010
(Continued)

*Primary Examiner* — Jorge L Carrasquillo
*Assistant Examiner* — Cortez Cook
(74) *Attorney, Agent, or Firm* — Muncy, Geissler, Olds & Lowe, P.C.

(57) ABSTRACT

A magnetic sensor integrated circuit, a motor and an application apparatus. The magnetic sensor includes a magnetic sensor, a signal processing unit, an output control circuit and an output port. The magnetic sensor receives a constant current sense a magnetic polarity of an external magnetic field and output a differential signal. The signal processing unit amplifies the differential signal and eliminates an offset of the differential signal to obtain a magnetic field detection signal. The output control circuit control, at least based on
(Continued)

the magnetic field detection signal, the magnetic sensor integrated circuit to operate in at least one a first state in which a current flows from the output port to the outside and a second state in which a current flows from the outside into the output port.

19 Claims, 20 Drawing Sheets

Related U.S. Application Data a continuation-in-part of application No. PCT/CN2015/086422, filed on Aug. 7, 2015.

(30) Foreign Application Priority Data

| Apr. 29, 2016 | (CN) | ............................ | 2016 1 0281764 |
| Jun. 3, 2016 | (CN) | ............................ | 2016 1 0393118 |

(51) Int. Cl.

| *B62D 5/04* | (2006.01) |
| *H02P 6/16* | (2016.01) |
| *H02P 6/20* | (2016.01) |
| *H02K 11/215* | (2016.01) |
| *G01R 33/07* | (2006.01) |
| *H02P 7/295* | (2016.01) |
| *H02P 6/30* | (2016.01) |
| *H02P 7/03* | (2016.01) |
| *H02P 6/22* | (2006.01) |

(52) U.S. Cl.
CPC ................. *H02P 6/30* (2016.02); *H02P 7/05* (2016.02); *H02P 7/295* (2013.01); *H02P 6/22* (2013.01); *H02P 2207/05* (2013.01)

(58) Field of Classification Search
USPC ................. 417/45; 318/254, 400.25; 361/23
See application file for complete search history.

(56) References Cited

U.S. PATENT DOCUMENTS

| 5,675,226 A | 10/1997 | Riola' | |
| 6,097,127 A * | 8/2000 | Rivera | ..................... H02K 3/28 |
| | | | 310/156.12 |
| 6,316,931 B1 * | 11/2001 | Nakagawa | ............. G01R 15/20 |
| | | | 324/117 R |

FOREIGN PATENT DOCUMENTS

| CN | 102075130 A | 5/2011 |
| DE | 102006055482 A1 | 6/2008 |

\* cited by examiner

US 10,199,965 B2

MAGNETIC SENSOR INTEGRATED CIRCUIT, MOTOR ASSEMBLY AND APPLICATION APPARATUS

CROSS REFERENCE TO RELATED APPLICATIONS

This non-provisional patent application is a continuation-in-part of U.S. patent application Ser. No. 14/822,353, which claims priority to Chinese Patent Application No. 201410390592.2, filed on Aug. 8, 2014 and to Chinese Patent Application No. 201410404474.2, filed on Aug. 15, 2014. In addition, this non-provisional patent application claims priority under the Paris Convention to PCT Patent Application No. PCT/CN2015/086422, filed with the Chinese Patent Office on Aug. 7, 2015, and to Chinese Patent Application No. CN201610281764.1, filed with the Chinese Patent Office on Apr. 29, 2016, and to Chinese Patent Application No. CN201610393118.4, filed with the Chines Patent Office on Jun. 3, 2016, all of which are incorporated herein by reference in their entirety.

FIELD

The present disclosure relates to magnetic field detection, more particularly, to a magnetic sensor integrated circuit, a motor assembly and an application apparatus.

BACKGROUND

During starting of a synchronous motor, the stator produces an alternating magnetic field causing the permanent magnetic rotor to be oscillated. The amplitude of the oscillation of the rotor increases until the rotor begins to rotate, and finally the rotor is accelerated to rotate in synchronism with the alternating magnetic field of the stator. To ensure the starting of a conventional synchronous motor, a starting point of the motor is set to be low, which results in that the motor cannot operate at a relatively high working point, thus the efficiency is low. In another aspect, the rotor cannot be ensured to rotate in a same direction every time since a stop or stationary position of the permanent magnetic rotor is not fixed. Accordingly, in applications such as a fan and water pump, the impeller driven by the rotor has straight radial vanes, which results in a low operational efficiency of the fan and water pump.

FIG. 1 illustrates a conventional drive circuit for a synchronous motor, which allows a rotor to rotate in a same predetermined direction in every time it starts. In the circuit, a stator winding 1 of the motor is connected in series with a TRIAC between two terminals M and N of an AC power source VM, and an AC power source VM is converted by a conversion circuit DC into a direct current voltage and the direct current is supplied to a position sensor H. A magnetic pole position of a rotor in the motor is detected by the position sensor H, and an output signal Vh of the position sensor H is connected to a switch control circuit PC to control the bidirectional thyristor T.

FIG. 2 illustrates a waveform of the drive circuit. It can be seen from FIG. 2 that, in the drive circuit, no matter the bidirectional thyristor T is switched on or off, the AC power source supplies power for the conversion circuit DC so that the conversion circuit DC constantly outputs and supplies power for the position sensor H (referring to a signal VH in FIG. 2). In a low-power application, in a case that the AC power source is commercial electricity of about 200V, the electric energy consumed by two resistors R2 and R3 in the conversion circuit DC is more than the electric energy consumed by the motor.

The magnetic sensor applies Hall effect, in which, when current I runs through a substance and a magnetic field B is applied in a positive angle with respect to the current I, a potential difference V is generated in a direction perpendicular to the direction of current I and the direction of the magnetic field B. The magnetic sensor is often implemented to detect the magnetic polarity of an electric rotor.

As the circuit design and signal processing technology advances, there is a need to improve the magnetic sensor integrated circuit for the ease of use and accurate detection.

BRIEF DESCRIPTION OF THE DRAWINGS

To illustrate technical solutions according to embodiments of the disclosure or in the conventional technology more clearly, the following briefly describes the drawings according to embodiments of the disclosure. Apparently, the drawings are only some embodiments of the present disclosure, and other drawings may be obtained by those skilled in the art according to those drawings without creative efforts.

FIG. 15b is a time-sequence diagram of four sub clock signals of the magnetic sensor and the first chopping switch of FIG. 15a;

FIG. 15c is a schematic diagram of control signals of a discharging switch and a first chopping switch of FIG. 15a;

FIG. 15d is a schematic signal diagram of a circuit shown in FIG. 15a;

DETAILED DESCRIPTION OF EMBODIMENTS

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, systems, components, and/or circuitry have been described at a relatively high-level, without detail, in order to avoid unnecessarily obscuring aspects of the present teachings.

Throughout the specification and claims, terms may have nuanced meanings suggested or implied in context beyond an explicitly stated meaning. Likewise, the phrase "in one embodiment/example" as used herein does not necessarily refer to the same embodiment and the phrase "in another embodiment/example" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1:
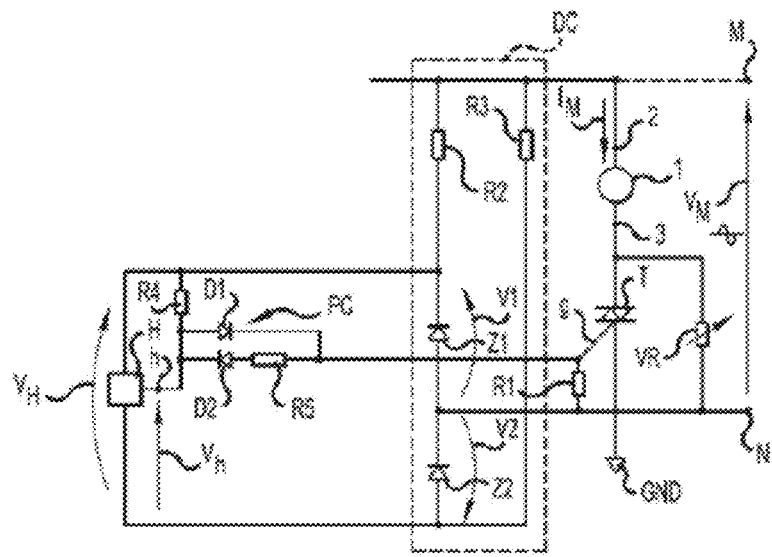
FIG. 1 illustrates a prior art drive circuit for a synchronous motor, according to an embodiment of the present teaching.
Figure 2:
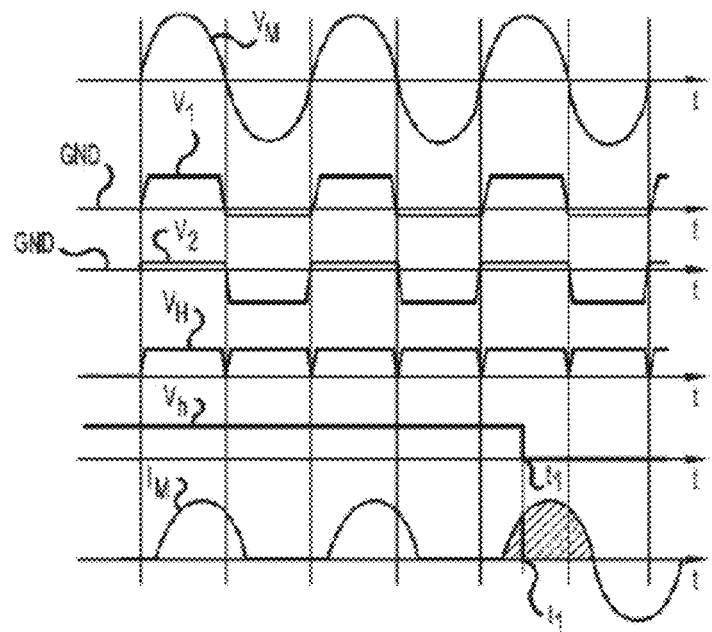
FIG. 2 illustrates waveforms at various locations of the drive circuit shown in FIG. 1.
Figure 3:
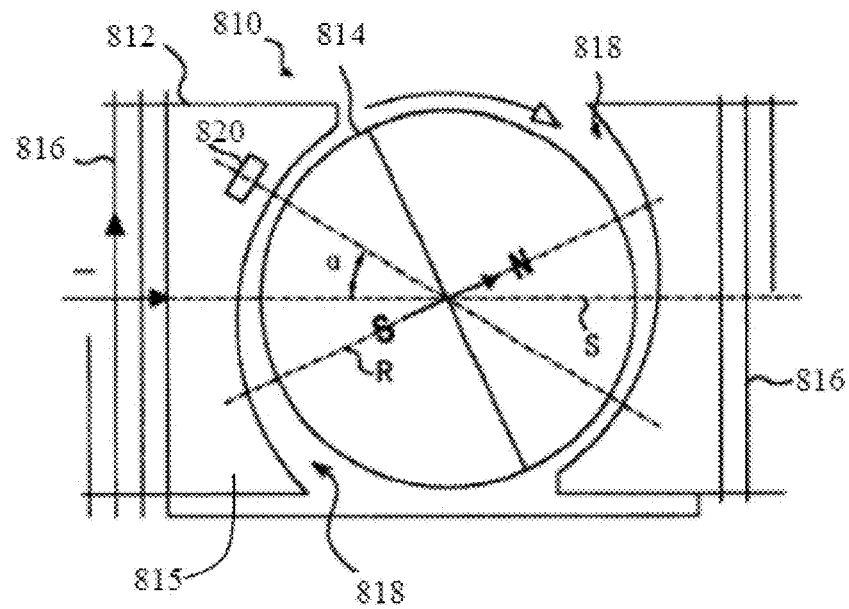
FIG. 3 illustrates a representation of a synchronous motor, according to an embodiment of the present teaching.

FIG. 3 schematically shows a synchronous motor according to an embodiment of the present invention. The synchronous motor 810 includes a stator 812 and a permanent magnet rotor 814 rotatably disposed between magnetic poles of the stator 812, and the stator 812 includes a stator core 815 and a stator winding 816 wound on the stator core 815. The rotor 814 includes at least one permanent magnet foaming at least one pair of permanent magnetic poles with opposite polarities, and the rotor 814 operates at a constant rotational speed of 60 f/p rpm during a steady state phase in a case that the stator winding 816 is connected to an AC power supply, where f is a frequency of the AC power supply and p is the number of pole pairs of the rotor.

Non-uniform gap 818 is formed between the magnetic poles of the stator 812 and the permanent magnetic poles of the rotor 814 so that a polar axis R of the rotor 814 has an angular offset a relative to a central axis S of the stator 812 in a case that the rotor is at rest. The rotor 814 may be configured to have a fixed starting direction (a clockwise direction in this embodiment as shown by the arrow in FIG. 3) every time the stator winding 816 is energized. The stator and the rotor each have two magnetic poles as shown in FIG. 3. It can be understood that, in other embodiments, the stator and the rotor may also have more magnetic poles, such as 4 or 6 magnetic poles.

A position sensor 820 for detecting the angular position of the rotor is disposed on the stator 812 or at a position near the rotor inside the stator, and the position sensor 820 has an angular offset relative to the central axis S of the stator. Preferably, this angular offset is also a, as in this embodiment. Preferably, the position sensor 820 is a Hall effect sensor.

Figure 4:
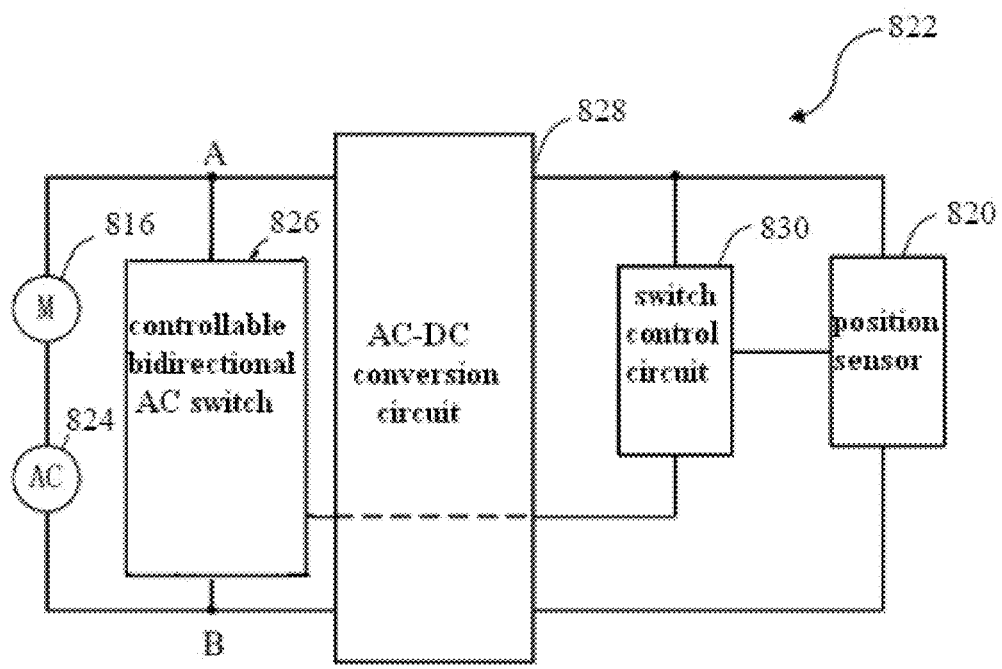
FIG. 4 illustrates a block diagram of a drive circuit for a synchronous motor, according to an embodiment of the present teaching.

FIG. 4 shows a block diagram of a drive circuit for a synchronous motor according to an embodiment of the present invention. In the drive circuit 822, the stator winding 816 and the AC power supply 824 are connected in series between two nodes A and B. Preferably, the AC power supply 824 may be a commercial AC power supply with a fixed frequency, such as 50 Hz or 60 Hz, and a supply voltage may be, for example, 110V, 220V or 230V. A controllable bidirectional AC switch 826 is connected between the two nodes A and B, in parallel with the stator winding 816 and the AC power supply 824. Preferably, the controllable bidirectional AC switch 826 is a TRIAC, of which two anodes are connected to the two nodes A and B respectively. It can be understood that, the controllable bidirectional AC switch 826 alternatively may be two silicon control rectifiers reversely connected in parallel, and control circuits may be correspondingly configured to control the two silicon control rectifiers in a preset way. An AC-DC conversion circuit 828 is also connected between the two nodes A and B. An AC voltage between the two nodes A and B is converted by the AC-DC conversion circuit 828 into a low voltage DC. The position sensor 820 may be powered by the low voltage DC output by the AC-DC conversion circuit 828, for detecting the magnetic pole position of the permanent magnet rotor 814 of the synchronous motor 810 and outputting a corresponding signal. A switch control circuit 830 is connected to the AC-DC conversion circuit 828, the position sensor 820 and the controllable bidirectional AC switch 826, and is configured to control the controllable bidirectional AC switch 826 to be switched between a switch-on state and a switch-off state in a predetermined way, based on the magnetic pole position of the permanent magnet rotor which is detected by the position sensor and polarity information of the AC power supply 824 which may be obtained from the AC-DC conversion circuit 828, such that the stator winding 816 urges the rotor 814 to rotate only in the above-mentioned fixed starting direction during a starting phase of the motor. According to this embodiment of the present invention, in a case that the controllable bidirectional AC switch 826 is switched on, the two nodes A and B are shorted, the AC-DC conversion circuit 828 does not consume electric energy since there is no current flowing through the AC-DC conversion circuit 828, hence, the utilization efficiency of electric energy can be improved significantly.

Figure 5:
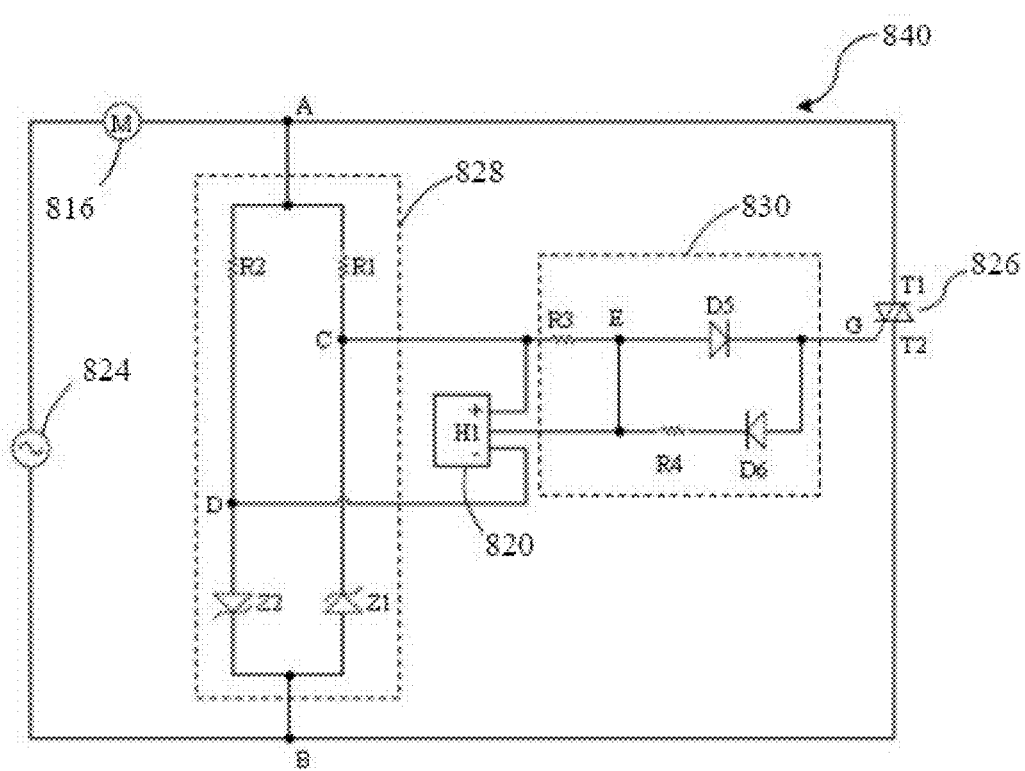
FIG. 5 illustrates a drive circuit for a synchronous motor, according to an embodiment of the present teaching.

FIG. 5 shows a circuit diagram of a drive circuit 840 for a synchronous motor according to a first embodiment of the present disclosure. The stator winding 816 of the synchronous motor is connected in series with the AC power supply 824 between the two nodes A and B. A first anode T1 of the TRIAC 826 is connected to the node A, and a second anode T2 of the TRIAC 826 is connected to the node B. The AC-DC conversion circuit 828 is connected in parallel with the TRIAC 826 between the two nodes A and B. An AC voltage between the two nodes A and B is converted by the AC-DC conversion circuit 828 into a low voltage DC (preferably, low voltage ranges from 3V to 18V). The AC-DC conversion circuit 828 includes a first zener diode Z1 and a second zener diode Z2 which are reversely connected in parallel between the two nodes A and B via a first resistor R1 and a second resistor R2 respectively. A high voltage output terminal C of the AC-DC conversion circuit 828 is formed at a connection point of the first resistor R1 and a cathode of the first zener diode Z1, and a low voltage output terminal D of the AC-DC conversion circuit 828 is formed at a connection point of the second resistor R2 and an anode of the second zener diode Z2. The voltage output terminal C is connected to a positive power supply terminal of the position sensor 820, and the voltage output terminal D is connected to a negative power supply terminal of the position sensor 820. Three terminals of the switch control circuit 830 are connected to the high voltage output terminal C of the AC-DC conversion circuit 828, an output terminal H1 of the position sensor 820 and a control electrode G of the TRIAC 826 respectively. The switch control circuit 830 includes a third resistor R3, a fifth diode D5, and a fourth resistor R4 and a sixth diode D6 connected in series between the output terminal HI of the position sensor 820 and the control electrode G of the controllable bidirectional AC switch 826. An anode of the sixth diode D6 is connected to the control electrode G of the controllable bidirectional AC switch 826. One terminal of the third resistor R3 is connected to the high voltage output terminal C of the AC-DC conversion circuit 828, and the other terminal of the third resistor R3 is connected to an anode of the fifth diode D5. A cathode of the fifth diode D5 is connected to the control electrode G of the controllable bidirectional AC switch 826.

Figure 6:
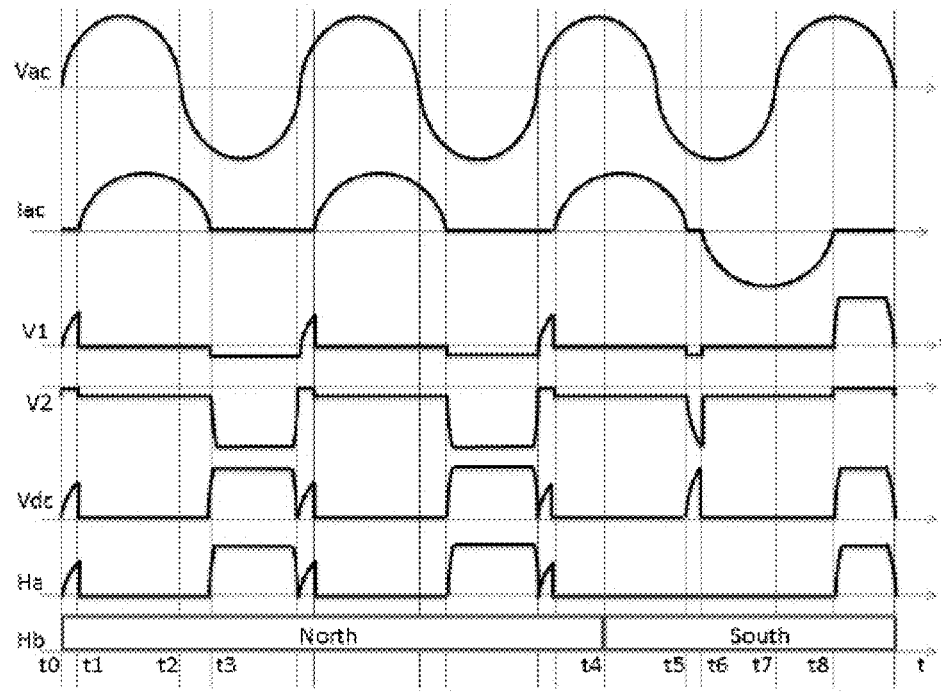
FIG. 6 illustrates waveforms at different locations of the drive circuit shown in FIG. 5.

In conjunction with FIG. 6, an operational principle of the drive circuit 840 is described. In FIG. 6, Vac indicates a waveform of voltage of the AC power supply 824, and Iac indicates a waveform of current flowing through the stator winding 816. Due to the inductive character of the stator winding 816, the waveform of current Iac lags behind the waveform of voltage Vac. V1 indicates a waveform of voltage between two terminals of the first zener diode Z1, V2 indicates a waveform of voltage between two terminals of the second zener diode Z2, Vdc indicates a waveform of voltage between two output terminals C and D of the AC-DC conversion circuit 828, Ha indicates a waveform of a signal output by the output terminal H1 of the position sensor 820, and Hb indicates a rotor magnetic field detected by the position sensor 820. In this embodiment, in a case that the position sensor 820 is powered normally, the output terminal HI outputs a logic high level in a case that the detected rotor magnetic field is North, or the output terminal H1 outputs a logic low level in a case that the detected rotor magnetic field is South.

In a case that the rotor magnetic field Hb detected by the position sensor 820 is North, in a first positive half cycle of the AC power supply, the supply voltage is gradually increased from a time instant t0 to a time instant t1, the output terminal H1 of the position sensor 820 outputs a high level, and a current flows through the resistor R1, the resistor R3, the diode D5 and the control electrode G and the second anode T2 of the TRIAC 826 sequentially. The TRIAC 826 is switched on in a case that a drive current flowing through the control electrode G and the second anode T2 is greater than a gate triggering current Ig. Once the TRIAC 826 is switched on, the two nodes A and B are shorted, a current flowing through the stator winding 816 in the motor is gradually increased until a large forward current flows through the stator winding 816 to drive the rotor 814 to rotate clockwise as shown in FIG. 3. Since the two nodes A and B are shorted, there is no current flowing through the AC-DC conversion circuit 28 from the time instant t1 to a time instant t2. Hence, the resistors R1 and R2 do not consume electric energy, and the output of the position sensor 820 is stopped due to no power is supplied. Since the current flowing through two anodes T1 and T2 of the TRIAC 826 is large enough (which is greater than a holding current Ihold), the TRIAC 826 is kept to be switched on in a case that there is no drive current flowing through the control electrode G and the second anode T2. In a negative half cycle of the AC power supply, after a time instant t3, a current flowing through T1 and T2 is less than the holding current Ihold, the TRIAC 826 is switched off, a current begins to flow through the AC-DC conversion circuit 828, and the output terminal HI of the position sensor 820 outputs a high level again. Since a potential at the point C is lower than a potential at the point E, there is no drive current flowing through the control electrode G and the second anode T2 of the TRIAC 826, and the TRIAC 826 is kept to be switched off. Since the resistance of the resistors R1 and R2 in the AC-DC conversion circuit 828 are far greater than the resistance of the stator winding 816 in the motor, a current currently flowing through the stator winding 816 is far less than the current flowing through the stator winding 816 from the time instant t1 to the time instant t2 and generates very small driving force for the rotor 814. Hence, the rotor 814 continues to rotate clockwise due to inertia. In a second positive half cycle of the AC power supply, similar to the first positive half cycle, a current flows through the resistor R1, the resistor R3, the diode D5, and the control electrode G and the second anode T2 of the TRIAC 826 sequentially. The TRIAC 826 is switched on again, and the current flowing through the stator winding 816 continues to drive the rotor 814 to rotate clockwise. Similarly, the resistors R1 and R2 do not consume electric energy since the two nodes A and B are shorted. In the next negative half cycle of the power supply, the current flowing through the two anodes T1 and T2 of the TRIAC 826 is less than the holding current Ihold, the TRIAC 826 is switched off again, and the rotor continues to rotate clockwise due to the effect of inertia.

At a time instant t4, the rotor magnetic field Hb detected by the position sensor 820 changes to be South from North, the AC power supply is still in the positive half cycle and the TRIAC 826 is switched on, the two nodes A and B are shorted, and there is no current flowing through the AC-DC conversion circuit 828. After the AC power supply enters the negative half cycle, the current flowing through the two anodes T1 and T2 of the TRIAC 826 is gradually decreased, and the TRIAC 826 is switched off at a time instant t5. Then the current flows through the second anode T2 and the control electrode G of the TRIAC 826, the diode D6, the resistor R4, the position sensor 820, the resistor R2 and the stator winding 816 sequentially. As the drive current is gradually increased, the TRIAC 826 is switched on again at a time instant t6, the two nodes A and B are shorted again, the resistors RI and R2 do not consume electric energy, and the output of the position sensor 820 is stopped due to no power is supplied. There is a larger reverse current flowing through the stator winding 816, and the rotor 814 continues to be driven clockwise since the rotor magnetic field is South. From the time instant t5 to the time instant t6, the first zener diode Z1 and the second zener diode Z2 are switched on, hence, there is a voltage output between the two output terminals C and D of the AC-DC conversion circuit 828. At a time instant t7, the AC power supply enters the positive half cycle again, the TRIAC 826 is switched off when the current flowing through the TRIAC 826 crosses zero, and then a voltage of the control circuit is gradually increased. As the voltage is gradually increased, a current begins to flow through the AC-DC conversion circuit 828, the output terminal H1 of the position sensor 820 outputs a low level, there is no drive current flowing through the control electrode G and the second anode T2 of the TRIAC 826, hence, the TRIAC 826 is switched off. Since the current flowing through the stator winding 816 is very small, nearly no driving force is generated for the rotor 814. At a time instant t8, the power supply is in the positive half cycle, the position sensor outputs a low level, the TRIAC 826 is kept to be switched off after the current crosses zero, and the rotor continues to rotate clockwise due to inertia. According to an embodiment of the present invention, the rotor may be accelerated to be synchronized with the stator after rotating only one circle after the stator winding is energized.

In the embodiment of the present invention, by taking advantage of a feature of a TRIAC that the TRIAC is kept to be switched on although there is no drive current flowing though the TRIAC once the TRIAC is switched on, it is avoided that a resistor in the AC-DC conversion circuit still consumes electric energy after the TRIAC is switched on, hence, the utilization efficiency of electric energy can be improved significantly.

Figure 7:
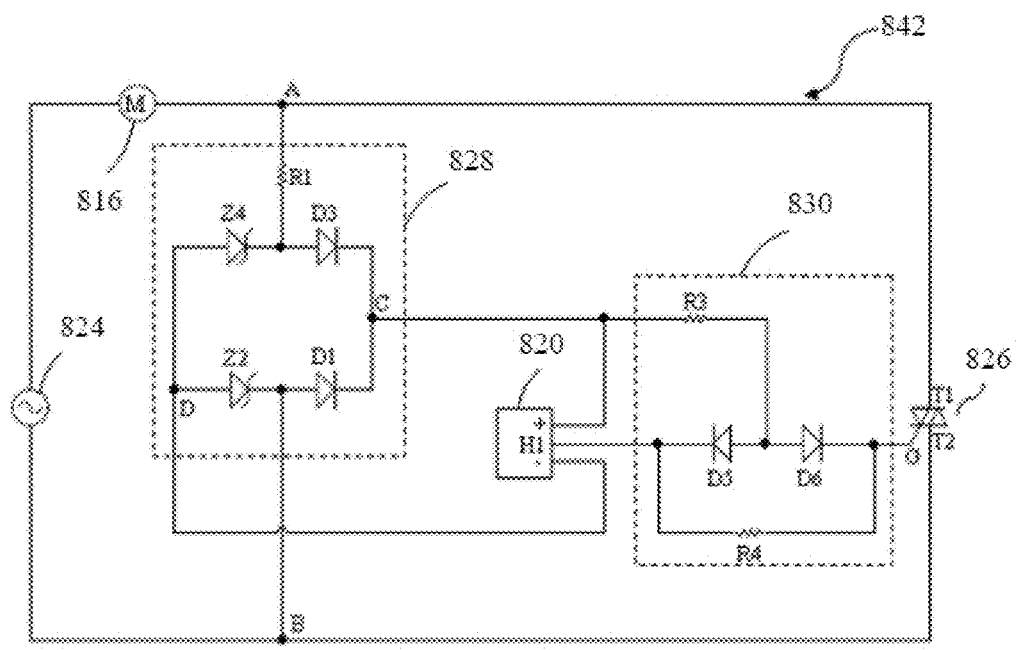
FIGS. 7 to 10 illustrate different embodiments of a drive circuit of a synchronous motor, according to an embodiment of the present teaching.

FIG. 7 shows a circuit diagram of a drive circuit 842 for a synchronous motor according to an embodiment of the present disclosure. The stator winding 816 of the synchronous motor is connected in series with the AC power supply 824 between the two nodes A and B. A first anode T1 of the TRIAC 826 is connected to the node A, and a second anode T2 of the TRIAC 826 is connected to the node B. The AC-DC conversion circuit 828 is connected in parallel with the TRIAC 826 between the two nodes A and B. An AC between the two nodes A and B is converted by the AC-DC conversion circuit 828 into a low voltage DC, preferably, a low voltage ranging from 3V to 18V. The AC-DC conversion circuit 828 includes a first resistor R1 and a full wave bridge rectifier connected in series between the two nodes A and B. The full wave bridge rectifier includes two rectifier branches connected in parallel, one of the two rectifier branches includes a first diode D1 and a third diode D3 reversely connected in series, and the other of the two rectifier branches includes a second zener diode Z2 and a fourth zener diode Z4 reversely connected in series, the high voltage output terminal C of the AC-DC conversion circuit 828 is formed at a connection point of a cathode of the first diode D1 and a cathode of the third diode D3, and the low voltage output terminal D of the AC-DC conversion circuit 828 is formed at a connection point of an anode of the second zener diode Z2 and an anode of the fourth zener diode Z4. The output terminal C is connected to a positive power supply terminal of the position sensor 820, and the output terminal D is connected to a negative power supply terminal of the position sensor 820. The switch control circuit 30 includes a third resistor R3, a fourth resistor R4, and a fifth diode D5 and a sixth diode D6 reversely connected in series between the output terminal H1 of the position sensor 820 and the control electrode G of the controllable bidirectional AC switch 826. A cathode of the fifth diode D5 is connected to the output terminal H1 of the position sensor, and a cathode of the sixth diode D6 is connected to the control electrode G of the controllable bidirectional AC switch. One terminal of the third resistor R3 is connected to the high voltage output terminal C of the AC-DC conversion circuit, and the other terminal of the third resistor R3 is connected to a connection point of an anode of the fifth diode D5 and an anode of the sixth diode D6. Two terminals of the fourth resistor R4 are connected to a cathode of the fifth diode D5 and a cathode of the sixth diode D6 respectively.

Figure 8:
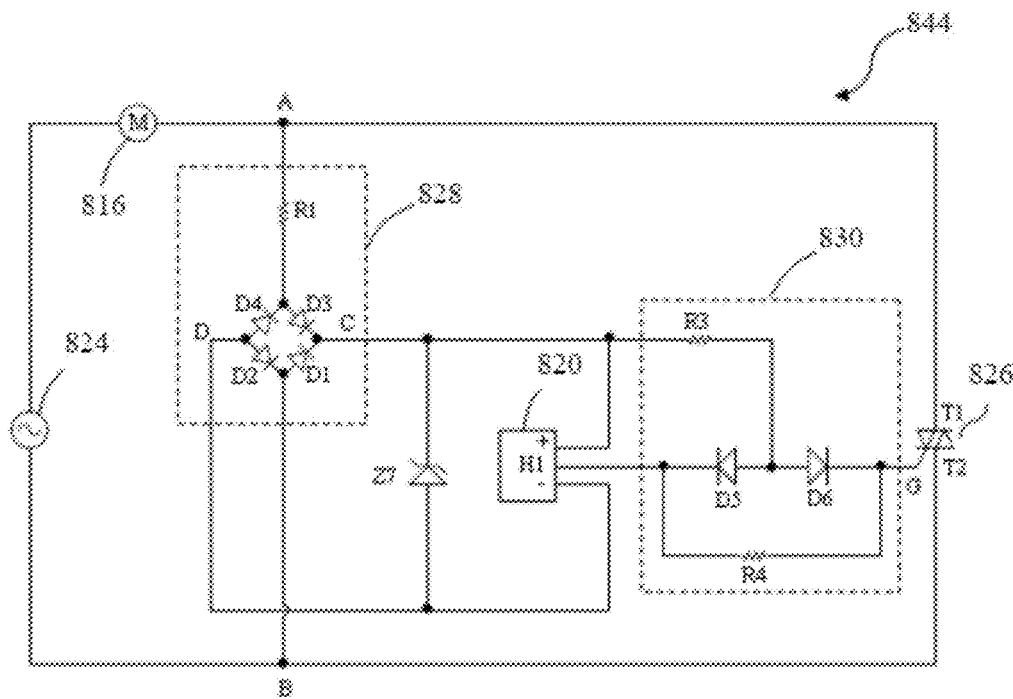

FIG. 8 shows a circuit diagram of a drive circuit 844 for a synchronous motor according to a further embodiment of the present invention. The drive circuit 844 is similar to the drive circuit 842 in the previous embodiment and, the drive circuit 844 differs from the drive circuit 842 in that, the zener diodes Z2 and Z4 in the drive circuit 842 are replaced by general diodes D2 and D4 in the rectifier of the drive circuit 844. In addition, a zener diode Z7 is connected between the two output terminals C and D of the AC-DC conversion circuit 828 in the drive circuit 844.

Figure 9:
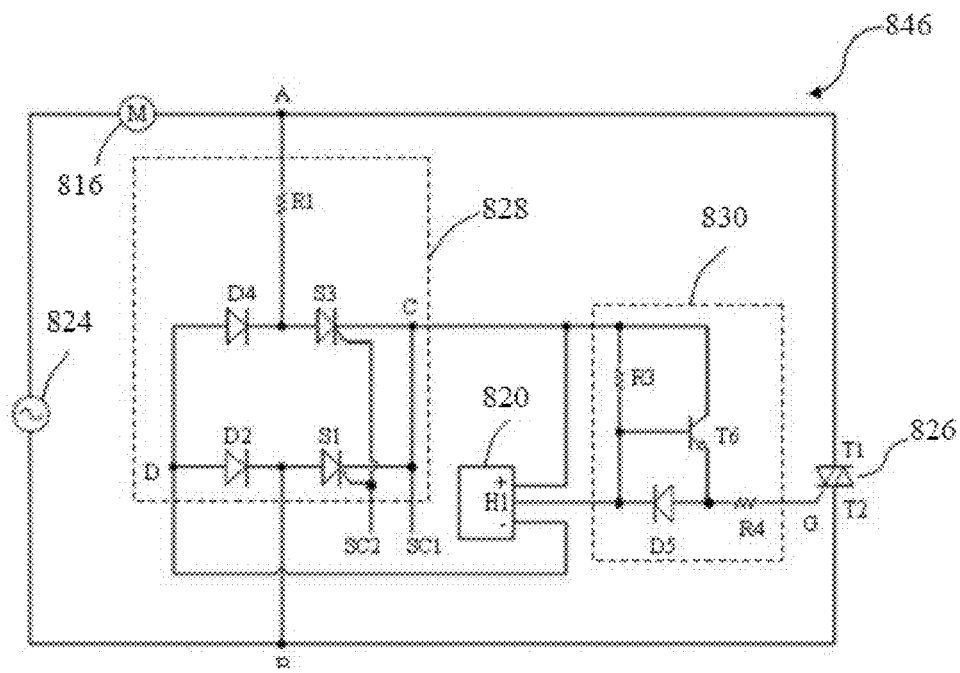

FIG. 9 shows a circuit diagram of a drive circuit 846 for a synchronous motor according to further embodiment of the present invention. The stator winding 816 of the synchronous motor is connected in series with the AC power supply 824 between the two nodes A and B. A first anode Ti of the TRIAC 826 is connected to the node A, and a second anode T2 of the TRIAC 826 is connected to the node B. The AC-DC conversion circuit 828 is connected in parallel with the TRIAC 826 between the two nodes A and B. An AC voltage between the two nodes A and B is converted by the AC-DC conversion circuit 828 into a low voltage DC, preferably, a low voltage ranging from 3V to 18V. The AC-DC conversion circuit 828 includes a first resistor R1 and a full wave bridge rectifier connected in series between the two nodes A and B. The full wave bridge rectifier includes two rectifier branches connected in parallel, one of the two rectifier branches includes two silicon control rectifiers S1 and S3 reversely connected in series, and the other of the two rectifier branches includes a second diode D2 and a fourth diode D4 reversely connected in series. The high voltage output terminal C of the AC-DC conversion circuit 828 is formed at a connection point of a cathode of the silicon control rectifier Si and a cathode of the silicon control rectifier S3, and the low voltage output terminal D of the AC-DC conversion circuit 828 is formed at a connection point of an anode of the second diode D2 and an anode of the fourth diode D4. The output terminal C is connected to a positive power supply terminal of the position sensor 820, and the output terminal D is connected to a negative power supply terminal of the position sensor 820. The switch control circuit 830 includes a third resistor R3, an NPN transistor T6, and a fourth resistor R4 and a fifth diode D5 connected in series between the output terminal H1 of the position sensor 820 and the control electrode G of the controllable bidirectional AC switch 826. A cathode of the fifth diode D5 is connected to the output terminal H1 of the position sensor. One terminal of the third resistor R3 is connected to the high voltage output terminal C of the AC-DC conversion circuit, and the other terminal of the third resistor R3 is connected to the output terminal H1 of the position sensor. A base of the NPN transistor T6 is connected to the output terminal H1 of the position sensor, an emitter of the NPN transistor T6 is connected to an anode of the fifth diode D5, and a collector of the NPN transistor T6 is connected to the high voltage output terminal C of the AC-DC conversion circuit.

In this embodiment, a reference voltage may be input to the cathodes of the two silicon control rectifiers S1 and S3 via a terminal SC1, and a control signal may be input to control terminals of S1 and S3 via a terminal SC2. The rectifiers Si and S3 are switched on in a case that the control signal input from the terminal SC2 is a high level, or are switched off in a case that the control signal input from the terminal SC2 is a low level. Based on the configuration, the rectifiers S1 and S3 may be switched between a switch-on state and a switch-off state in a preset way by inputting the high level from the terminal SC2 in a case that the drive circuit operates normally. The rectifiers S1 and S3 are switched off by changing the control signal input from the terminal SC2 from the high level to the low level in a case that the drive circuit fails. In this case, the TRIAC 826, the conversion circuit 828 and the position sensor 820 are switched off, to ensure the whole circuit to be in a zero-power state.

Figure 10:
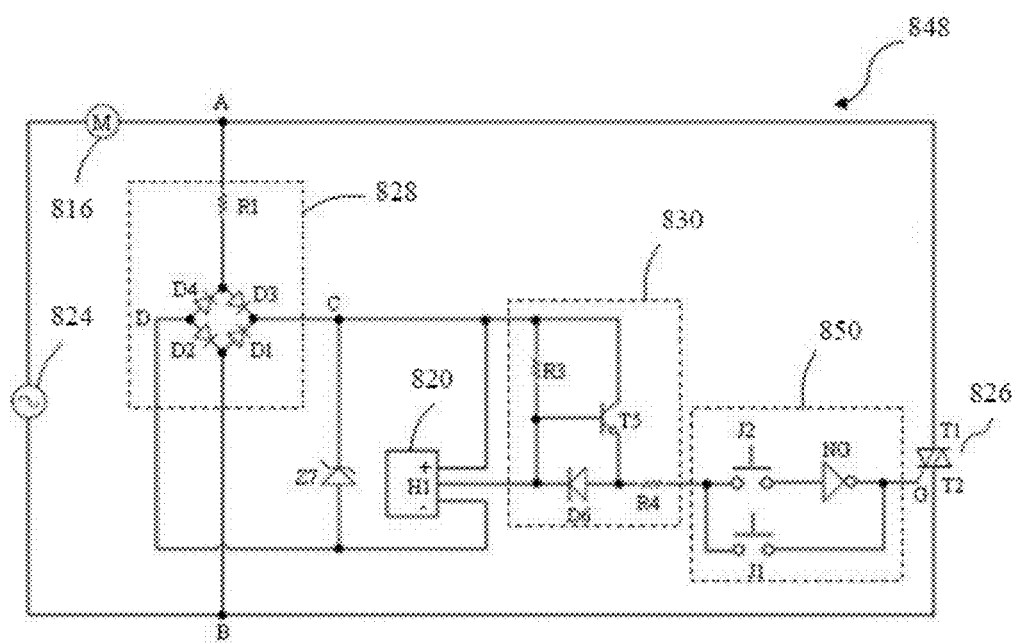

FIG. 10 shows a circuit diagram of a drive circuit 848 for a synchronous motor according to another embodiment of the present invention. The drive circuit 848 is similar to the drive circuit 846 in the previous embodiment and, the drive circuit 848 differs from the drive circuit 846 in that, the silicon control diodes S1 and S3 in the drive circuit 846 are replaced by general diodes D1 and D3 in the rectifier of the drive circuit 848, and a zener diode Z7 is connected between the two terminals C and D of the AC-DC conversion circuit 828. In addition, in the drive circuit 848 according to the embodiment, a preset steering circuit 850 is disposed between the switch control circuit 30 and the TRIAC 826. The preset steering circuit 850 includes a first jumper switch J1, a second jumper J2 switch and an inverter NG connected in series with the second jumper switch J2. Similar to the drive circuit 846, in this embodiment, the switch control circuit 830 includes the resistor R3, the resistor R4, the NPN transistor T5 and the diode D6. One terminal of the resistor R4 is connected to a connection point of an emitter of the transistor T5 and an anode of the diode D6, and the other terminal of the resistor R4 is connected to one terminal of the first jumper switch J1, and the other terminal of the first jumper switch J1 is connected to the control electrode G of the TRIAC 826, and the second jumper switch J2 and the inverter NG connected in series are connected across two terminals of the first jumper switch J1. In this embodiment, when the first jumper switch J1 is switched on and the second jumper switch J2 is switched off, similar to the above embodiments, the rotor 814 still starts clockwise; when the second jumper switch J2 is switched on and the first jumper switch J1 is switched off, the rotor 814 starts counterclockwise. In this case, a starting direction of the rotor in the motor may be selected by selecting one of the two jumper switches to be switched on and the other to be switched off. Therefore, in a case that a driving motor is needed to be supplied for different applications having opposite rotational directions, it is just needed to select one of the two jumper switches J1 and J2 to be switched on and the other to be switched off, and no other changes need to be made to the drive circuit, hence, the drive circuit according to this embodiment has good versatility.

More details are disclosed about a magnetic sensor that comprises aspects of both the position sensor 820 and the switch control circuit 830. In describing the details of the magnetic sensor related to both the position sensor 20 and the switch control circuit 830, the present teaching of this continuation-in-part application more focuses on various details related to the realization of the position sensor 820 within the magnetic sensor as disclosed herein.

The magnetic sensor in the present teaching employs at least one folded cascode amplifier. The folded cascode amplifier can efficiently amplify a very small input signals to have a great gain. In addition, the folded cascode amplifier is configured with excellent frequency characteristics and is capable of processing signals expanded in a very wide frequency range. Further, the magnetic sensor in the present teaching may be directly connected to the city AC power supply with no need of additional A/D converting equipment. Therefore, the present teaching facilitates the implementation of the magnetic sensor into various fields. Further, the magnetic field detecting circuit can effectively amply the detected magnetic field signal, regulate the voltage and filter interference signals. Therefore, the magnetic sensor can generate more accurate signal with respect to the polarity of the external magnetic field to control the operation of the electric rotor.

In view of this, a magnetic sensor integrated circuit, an electric motor assembly and an application apparatus are provided according to embodiments of the disclosure, to reduce cost of the whole circuit and improve reliability of the whole circuit by expanding functions of a conventional magnetic sensor integrated circuit. In order to achieve the above object, the technical solutions according to the embodiments of the present disclosure are described in detail in conjunction with FIG. 11 to FIG. 25.

Figure 11:
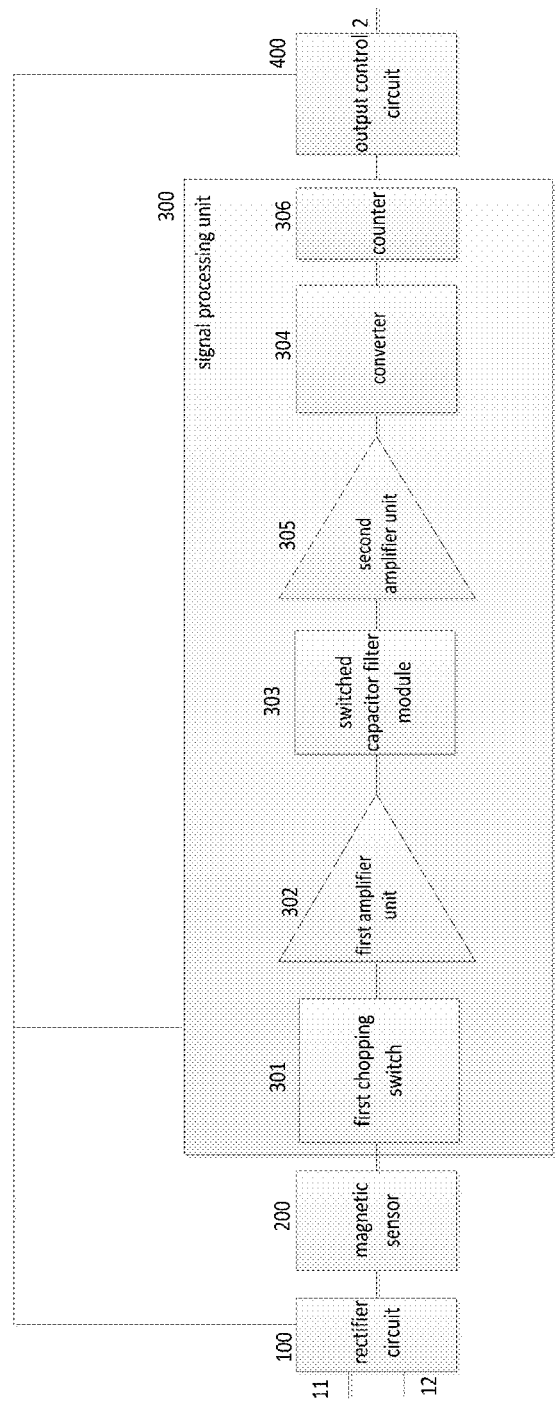
FIG. 11 is a block diagram of a magnetic sensor integrated circuit according to an embodiment of the present disclosure.

FIG. 11 shows a schematic structural diagram of a magnetic sensor integrated circuit according to an embodiment of the present disclosure, and the magnetic sensor integrated circuit includes: an input port, a rectifier circuit 100, a magnetic sensor 200, a signal processing unit 300, an output control circuit 400 and an output port 2.

The rectifier circuit 100 can convert an external power into a direct-current power.

The magnetic sensor 200 can receive a constant current not affected by temperature change to sense a polarity of an external magnetic field and output a differential signal.

The signal processing unit 300 can convert the differential signal output by the magnetic sensor 200 into a magnetic field detection signal by amplifying the differential signal and eliminating an offset of the differential signal, and output the magnetic field detection signal.

The output control circuit 400 can control the magnetic sensor integrated circuit to operate in at least a first state or a second state. In the embodiment, the first state can be a current flow from the output port 2 to the outside, and the second state can be a current flow from the outside into the output port 2. In the embodiment, the differential signal includes a magnetic field signal and an offset signal.

In the embodiment of the present disclosure, the external power is provided to the rectifier circuit via the input port, and the input port may include a first input port 11 and a second input port 12 which are electrically connected to the external power. In the embodiment of the present disclosure, the connection between the input port and the external power may be a direct connection or an indirect connection, which is not limited herein and needs to be designed based on actual applications. In the embodiment of the present disclosure, the external power received by the rectifier circuit is an alternating-current power. In addition, the constant current, which is not affected by temperature change, received by the magnetic sensor may be provided by the rectifier circuit, which is not limited herein.

Figure 12:
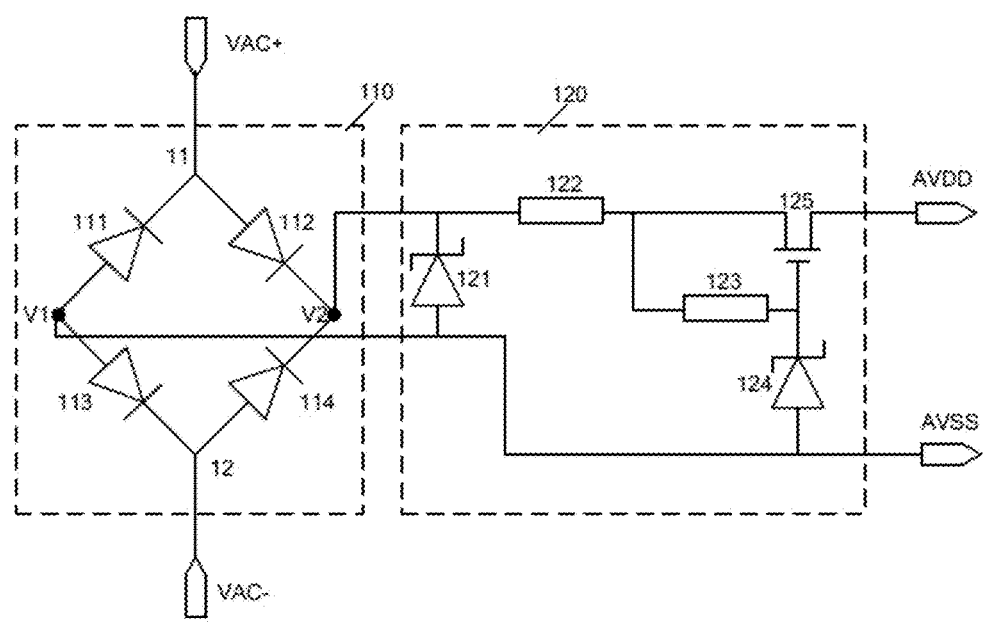
FIG. 12 is a circuit diagram of a rectifier circuit according to an embodiment of the present disclosure.

In an embodiment of the present disclosure, the rectifier circuit 100 may include a full-wave rectifier bridge and a voltage stabilizing unit coupled to an output end of the full-wave rectifier bridge. The full-wave rectifier bridge can convert an alternating-current signal output by the alternating-current power into a direct-current signal, and the voltage stabilizing unit can stabilize the direct-current signal output by the full-wave rectifier bridge in a predetermined range. FIG. 12 shows a circuit diagram of a rectifier circuit according to an embodiment of the present disclosure, a full-wave rectifier bridge 110 can include a first diode 111 and a second diode 112 which are coupled in series, and a third diode 113 and a fourth diode 114 which are coupled in series. A first input end 11 is a common end between the first diode 111 and the second diode 112 and electrically connected to an alternating-current power VAC+, and a second input end 12 is a common end between the third diode 113 and the fourth diode 114 and electrically connected to an alternating-current power VAC−.

An input end of the first diode 111 is electrically connected to an input end of the third diode 113 to form a first output end V1 of the full-wave rectifier bridge 110, and an output end of the second diode 112 is electrically connected to an output end of the fourth diode 114 to form a second output end V2 of the full-wave rectifier bridge 110. The second output end V2 outputs a direct-current voltage of about 16V. Preferably, the output control circuit 400 is powered by the direct-current voltage output by the second output end V2 of the full-wave rectifier bridge 110.

Moreover, a voltage stabilizing unit 120 includes a Zener diode 121, a first resistor 122, a second resistor 123, a Zener diode 124 and a transistor 125 which are electrically connected between the first output end V1 and the second output end V2 of the full-wave rectifier bridge 110. An anode of the Zener diode 121 and an anode of the Zener diode 124 are both coupled to the first output end V1 of the full-wave rectifier bridge 110. A cathode of the Zener diode 121 and a first end of the first resistor 122 are both coupled to the second output end V2 of the full-wave rectifier bridge 110. A second end of the first resistor 122 is coupled to a first end of the second resistor 123 and a first end of the transistor 125. A second end of the second resistor 123 is electrically connected to a gate of the transistor 125 and a cathode of the Zener diode 124. A second end of the transistor 125 and an anode of the Zener diode 124 respectively serve as two output ends of the voltage-regulation unit 120, i.e. two output ends of the rectifier circuit. An output voltage of the first output end AVDD of the rectifier circuit is a direct-current voltage of about 5V, and the second output end AVSS is grounded.

As shown in FIG. 11, the signal processing unit 300 according to the embodiment of the present disclosure includes a first chopping switch 301, a first amplifier unit 302, a switched capacitor filter module 303 and a converter 304 which are electrically connected sequentially. The first chopping switch 301 is electrically coupled to the magnetic sensor 200.

The first chopping switch 301 can modulate the magnetic field signal and the offset signal of the differential signal output by the magnetic sensor 200, to a high frequency region and a baseband frequency region respectively.

The first amplifier unit 302 is configured to amplify the differential signal output by the first chopping switch 301, and demodulate the magnetic field signal and the offset signal of the differential signal output by the first chopping switch, to the high frequency region and the baseband frequency respectively, and output the demodulated magnetic field signal and the demodulated offset signal.

The switched capacitor filter module 303 can sample the differential signal output by the first amplifier unit 302, eliminate an offset of the sampled signal to obtain a differential signal, amplify the differential signal, and output the amplified differential signal.

The converter 304 can convert the differential signal output by the switched capacitor filter module 303 into a magnetic field detection signal and output the magnetic field detection signal to the output control circuit 400. In the embodiment, the converter is an analog-digital conversion module.

Figure 13:
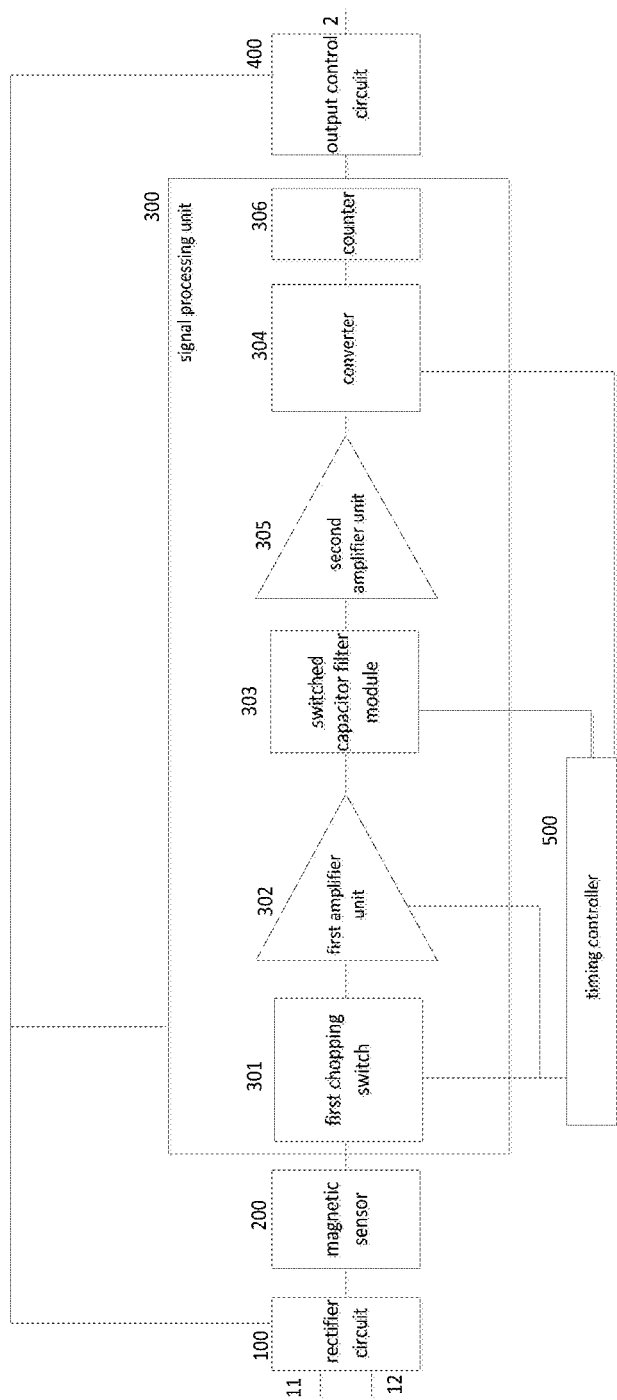
FIG. 13 is a structural diagram of a magnetic sensor integrated circuit according to another embodiment of the present disclosure.
Figure 14:
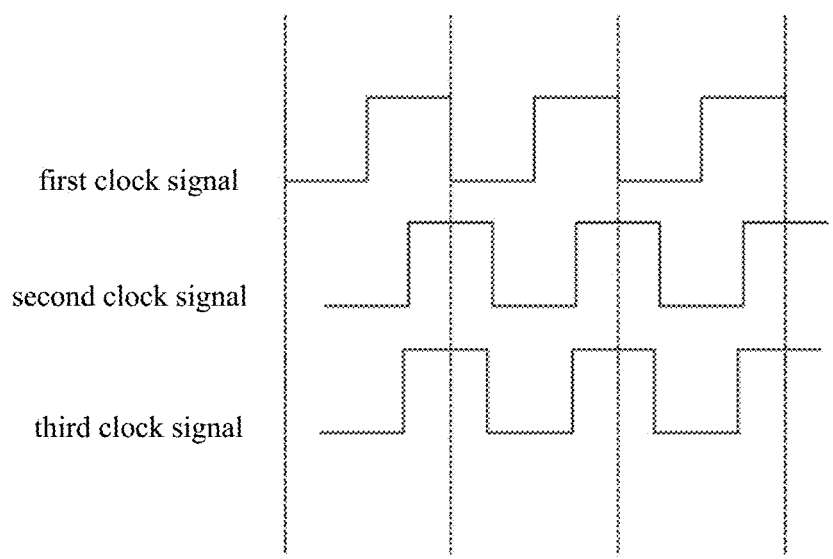
FIG. 14 is a schematic diagram of signals of a timing controller according to an embodiment of the present disclosure.

Furthermore, in order to ensure a better running performance of the magnetic sensor integrated circuit, FIG. 13 shows a schematic structural diagram of a magnetic sensor integrated circuit according to another embodiment of the present disclosure, and as shown in FIG. 13, the magnetic sensor integrated circuit further includes a timing controller 500. The timing controller 500 is configured to output a first clock signal to the first chopping switch 301 and the first amplifier unit 302, output a second clock signal to the switched capacitor filter module 303 and output a third clock signal to the converter 304. The second clock signal is delayed for a first predetermined time with respect to the first clock signal, and is delayed for a second predetermined time with respect to the third clock signal. The first predetermined time is longer than the second predetermined time. A frequency of the first clock signal is a chopping frequency of the first chopping switch 301, and a frequency of the second clock signal is a sampling frequency of the switched capacitor filter module 303.

In order to ensure an accuracy of an output signal, there is a predetermined delay between the first clock signal, the second clock signal and the third clock signal. Optionally, in the embodiment of the present disclosure, the first predetermined time may be a quarter of a cycle of the first clock signal, and the second predetermined time is 5 nanoseconds. Furthermore, the first clock signal, the second clock signal and the third clock signal have a same frequency in the embodiment of the present disclosure. Optionally, reference may be made to FIG. 14 which is a schematic diagram of signals of a timing controller according to an embodiment of the application. It should be noted that, the first to third clock signals as shown in the FIG. 14 only illustrate a time-sequence relationship (i.e. optionally, the first predetermined time may be a quarter of the cycle of the first clock signal, and the second clock signal may be delayed for 5 nanoseconds with respect to the third clock signal) and a frequency relationship (i.e. the first clock signal, the second clock signal and the third clock signal have a same frequency) between the three signals, and do not represent real signals in an operation of the magnetic sensor according to the embodiment of the application.

In the embodiment of the present disclosure, the differential signal output by the magnetic sensor includes the magnetic field signal and the offset signal. The magnetic field signal is an ideal magnetic field voltage signal matching with an external magnetic field and detected by the magnetic sensor, and the offset signal is an inherent offset of the magnetic sensor. The ideal magnetic field voltage signal output by the magnetic sensor is weak, and generally is only a few tenths millivolts, while the offset signal is close to 10 millivolts. Therefore, in the subsequent process, it is required to eliminate the offset signal, and to amplify the ideal magnetic field voltage signal.

For processing the differential signal output by the magnetic sensor, firstly the magnetic field signal of the differential signal is modulated to a high frequency region by the first chopping switch 301. As shown in FIG. 13, the first chopping switch 301 modulates the magnetic field signal of the differential signal output by the magnetic sensor 200 to a high frequency region and modulates the offset signal of the differential signal to a baseband frequency, based on the control of the timing controller 500. Preferably, a frequency of the high frequency region is greater than 100K Hertz and a baseband frequency is less than 200 Hertz.

Figure 15A:
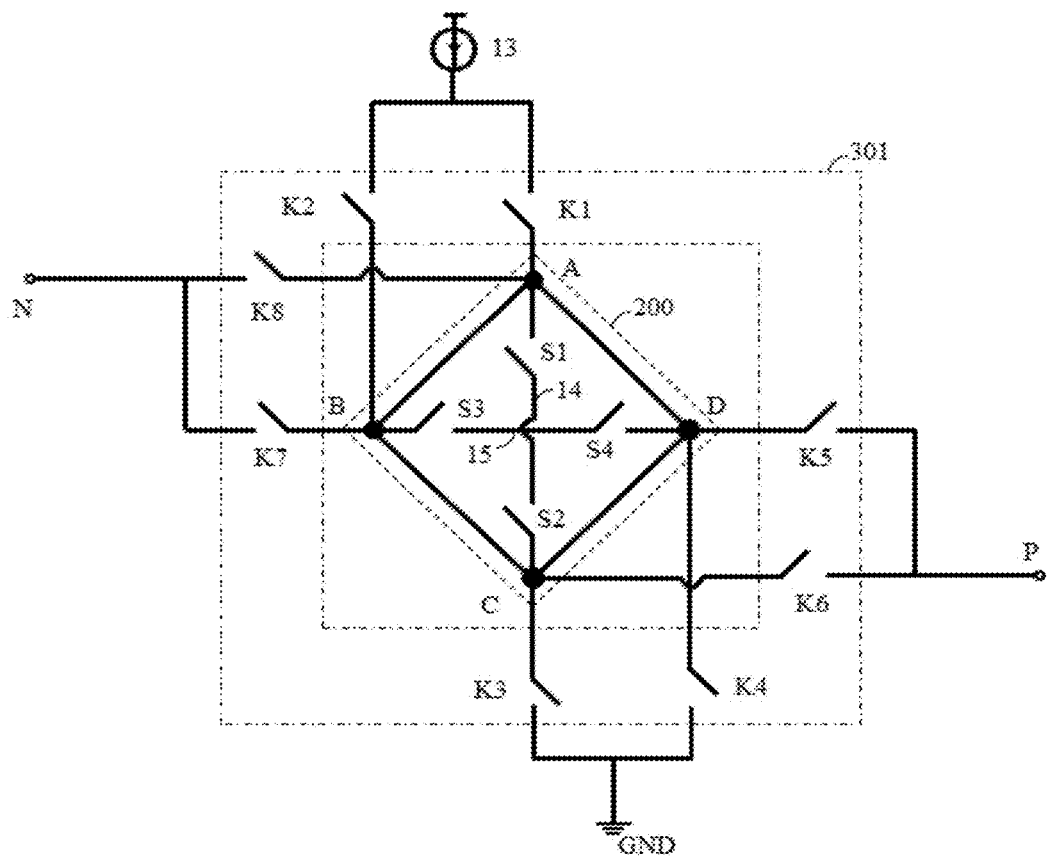
FIG. 15a is a structural diagram of a magnetic sensor and a first chopping switch according to an embodiment of the present disclosure.
Figure 15B:
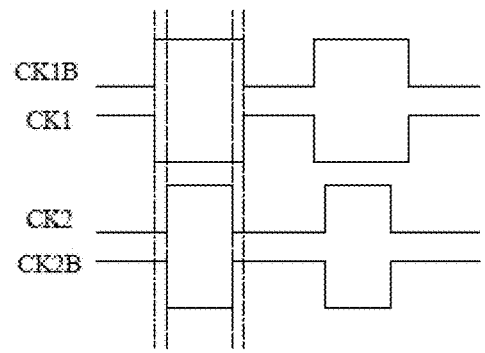
Figure 15C:
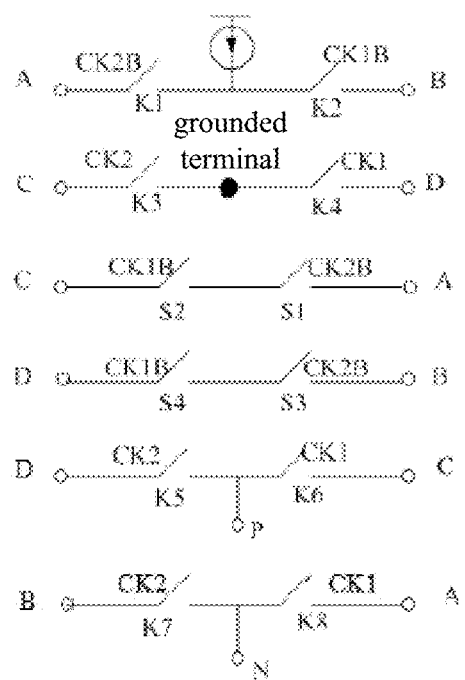

References are made to FIGS. 5a to 5d. FIG. 15a is a structural diagram of a magnetic sensor and a first chopping switch according to an embodiment of the present disclosure. FIG. 15b is a timing diagram of four sub clock signals of the magnetic sensor and the first chopping switch shown in FIG. 15a. FIG. 15c is a schematic diagram of signal controls of a discharging switch and the first chopping switch shown in FIG. 15a.

The magnetic sensor 200 includes four contact terminals. The magnetic sensor 200 includes a first terminal A and a third terminal C which are arranged oppositely, and a second terminal B and a fourth terminal D which are arranged oppositely. In the embodiment of the present disclosure, the magnetic sensor 200 is a Hall plate. The magnetic sensor 200 is driven by a first power 13 which may be provided by the rectifier circuit 100. In the embodiment, the power 13 is a constant current source not affected by temperature change.

The first chopping switch 301 includes eight switches: K1 to K8 as shown in FIG. 15a, which are electrically connected to the four terminals. Specifically, the first chopping switch 301 includes a first switch K1, a second switch K2, a third switch K3, a fourth switch K4, a fifth switch K5, a sixth switch K6, a seventh switch K7 and an eighth switch K8. The first switch K1 is electrically connected between the first power 13 and the first terminal A. The second switch K2 is electrically connected between the first power 13 and the second terminal B. The third switch K3 is electrically connected between a grounded end GND and the third terminal C. The fourth switch K4 is electrically connected between the grounded end GND and the fourth terminal D. The fifth switch K5 is electrically connected between a first output end P and the fourth terminal D. The sixth switch K6 is electrically connected between the first output end P and the third terminal C. The seventh switch K7 is electrically connected between a second output end N and the second terminal B. The eighth switch K8 is electrically connected between the second output end N and the first terminal A. The first clock signal includes a first sub clock signal CK2B, a second sub clock signal CK1B, a third clock signal CK2 and a fourth sub clock signal CK1. The first switch K1 and the second switch K2 are respectively controlled by the first sub clock signal CK2B and the second sub clock signal CK1B. The third switch K3 and the fourth switch K4 are respectively controlled by the third sub clock signal CK2 and the fourth sub clock signal CK1. The fifth switch K5 and the sixth switch K6 are respectively controlled by the third sub clock signal CK2 and the fourth sub clock signal CK1. The seventh switch K7 and the eighth switch K8 are respectively controlled by the third sub clock signal CK2 and the fourth sub clock signal CK1.

In order to ensure an accuracy of an output signal, the first clock signal includes at least two non-overlapping sub clock signals. A phase of the first sub clock signal CK2B is opposite to a phase of the third sub clock signal CK2, and a phase of the second sub clock signal CK1B is opposite to a phase of the fourth sub clock signal CK1. The third sub clock signal CK2 and the fourth sub clock signal CK1 are non-overlapping sub clock signals.

When the first terminal A is electrically connected to the first power 13 and the third terminal C is electrically connected to the grounded end GND, the second terminal B is electrically connected to the second output end N and the fourth terminal D is electrically connected to the first output end P. When the second terminal B is electrically connected to the first power 13 and the fourth terminal D is electrically connected to the grounded end GND, the first terminal A is electrically connected to the second output end N and the third terminal C is electrically connected to the first output end P. The first output end P outputs a differential signal P1, and the second output end N outputs a differential signal N1.

Besides the magnetic sensor 200 and the first chopping switch 301 described, the magnetic sensor 200 further includes a first discharging branch 14 electrically connected between the first terminal A and the third terminal C, i.e. a branch between the first terminal A and the third terminal C, and a second discharging branch 15 electrically connected between the second terminal B and the fourth terminal D, i.e. a branch between the second terminal B and the fourth terminal D. Before the first terminal A and the third terminal C serve as power input ends and the second terminal B and the fourth terminal D serve as magnetic sensed signal output ends, the second discharging branch 15 is conductive. Before the first terminal A and the third terminal C serve as magnetic sensed signal output ends and the second terminal B and the fourth terminal D serve as power input ends, the first discharging branch 14 is conductive.

In a possible implementation, the first discharging branch 14 may include a first discharging switch S1 and a second discharging switch S2 which are electrically connected in series. The first discharging switch Si and the second discharging switch S2 are respectively controlled by the first sub clock signal CK2B and the second sub clock signal CK1B. The second discharging branch 15 includes a third discharging switch S3 and a fourth discharging switch S4 which are electrically connected in series. The third discharging switch S3 and the fourth discharging switch S4 are respectively controlled by the first sub clock signal CK2B and the second sub clock signal CK1B.

When the first terminal A and the third terminal C serve as power input ends and the second terminal B and the fourth terminal D serve as output ends of the magnetic field signal, during a period that the first sub clock signal CK2B overlaps with the second sub clock signal CK1B, the first discharging switch S1 and the second discharging switch S2 are simultaneously turned on. When the first terminal A and the third terminal C serve as output ends of the magnetic field signal and the second terminal B and the fourth terminal D serve as power input ends, during a period that the first sub clock signal CK2B overlaps with the second sub clock signal CK1B, the third discharging switch S3 and the fourth discharging switch S4 are simultaneously turned on.

As shown in FIG. 15b, the four sub clock signals includes two non-overlapping control signals, i.e. the third sub clock signal CK1 and the fourth sub clock signal CK2, and two overlapping control signals, i.e. the second sub clock signal CK1B and the first sub clock signal CK2B. CK1 is opposite to CK1B and CK2 is opposite to CK2B. The overlapping sub clock signals CK1B and CK2B are both at a high level during the period in which CK1B overlaps with CK2B, i.e., a period of time between two dotted lines as shown in FIG. 15b. The two non-overlapping sub clock signals CK1 and CK2 and the two overlapping sub clock signals CK1B and CK2B may have a frequency ranging from 100 KHz to 600 KHz inclusively, and preferably may have a frequency of 400 KHz.

In the embodiment of the present disclosure, the eight switches included in the first chopping switch 301 and the four discharging switches included in the discharging branches each may be a transistor. Furthermore, when CK1 is high level, CK2B is high level, and CK2 and CK1B are low level. In conjunction with FIG. 15c, in such case, the second terminal B and the fourth terminal D are respectively electrically connected to the first power 13 and the grounded end GND and serve as the power input ends, the switches between the third terminal C and the first output end P are turned on, the switches between the first terminal A and the second output N are turned on, and the first terminal A and the third terminal C serve as output ends of the magnetic field signal. A short period of time just after transition of CK1 from the high level to the low level, i.e. a period of time between the first two dotted lines as shown in FIG. 15b, is an overlapping period of the two overlapping sub clock signals CK1B and CK2B. In the overlapping period, CK1B and CK2B are both high level, the third discharging switch S3 and the fourth discharging switch S4 between the second terminal B and the fourth terminal D are simultaneously turned on, and the second terminal B is short-circuited with the fourth terminal D thereby eliminating charges stored in a parasitic capacitor between the second terminal B and the fourth terminal D. After the overlapping period, when CK1 is low level, CK2B is low level, and CK2 and CK1B are high level. In this case, the first terminal A and the third terminal C are respectively electrically connected to the first power and the grounded end GND and serve as power input ends, the switches between the second terminal B and the first output end P are turned on, the switches between the fourth terminal D and the second output end N are turned on, and the second terminal B and the fourth terminal D serve as output ends of the magnetic field signal. A short period of time just before transition of CK1 from the low level to the high level, i.e. a period of time between the second two dotted lines as shown in FIG. 15b, is an overlapping period of the two sub clock signals CK1B and CK2B. In this period, CK1B and CK2B are both high level, the first discharging switch S1 and the second discharging switch S2 between the first terminal A and the third terminal C are turned on, and the terminal A is short-circuited with the third terminal C, thereby eliminating charges stored in a parasitic capacitor between the first terminal A and the third terminal C.

Figure 15D:
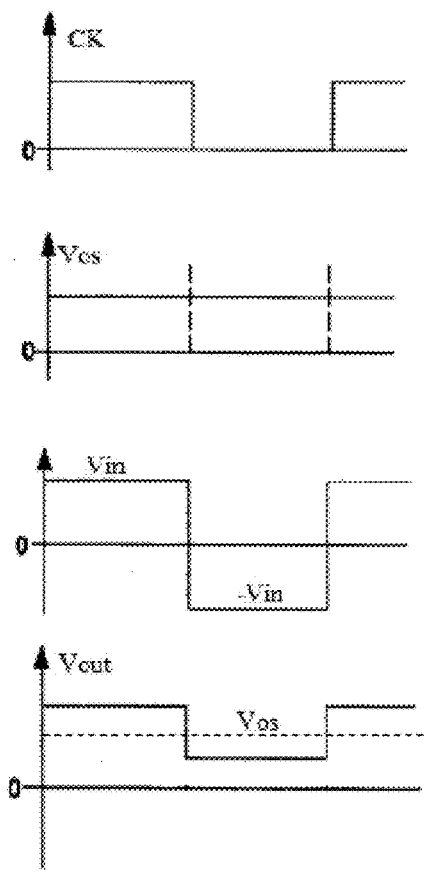

FIG. 15d is a schematic diagram of signals in the circuit shown in FIG. 15a. In FIG. 15d, CK is a clock signal, Vos is an offset voltage signal of the magnetic sensor 200 which may be assumed to be constant at any instant in a clock signal cycle and depends on a physical property of the Hall plate 200. Vin and −Vin are ideal magnetic field signals output by the first chopping switch in a first half cycle and a second half cycle of the clock signal CK respectively, i.e., ideal outputs of the Hall plate 200 not interfered by an offset signal. As described in the above, in the first half cycle of the clock signal CK, the terminals A and C are electrically connected to the first power and the ground respectively, and the terminals B and D are electrically connected to output ends. In the second half of the cycle of the clock signal CK, the terminals B and D are respectively electrically connected to the first power and the ground, and the terminals A and C are electrically connected to output ends. In the first and second half cycles of the clock signal CK, the ideal magnetic field signals output by the first chopping switch have the same magnitude and opposite directions. Vout is an output signal of the first chopping switch, which is a signal superposition of the offset signal Vos and the ideal magnetic field signal Vin. In this way, the magnetic field signal is modulated to the high frequency region with the first chopping switch.

In an embodiment of the present disclosure, the ideal magnetic field voltage signal output by the magnetic sensor 200 is very weak. Generally, the ideal magnetic field signal is only a few tenths millivolts, and the offset signal is close to 10 millivolts. Therefore, it is required to eliminate the offset signal and amplify the ideal magnetic field signal subsequently.

As shown in FIG. 13, the first amplifier unit 302 according to the embodiment amplify the differential signal output by the first chopping switch 301, demodulates the magnetic field signal of the differential signal output by the first chopping switch 301 to a low frequency area and outputs the demodulated differential signal, based on the control of the timing controller 500. In any one of the above embodiments of the present disclosure, a sensitivity of the magnetic sensor 200 is required to be high, and the magnetic field signal output by the magnetic sensor 200 may be very weak, for example, may be only a few tenth millivolts. Thus, the magnetic field signal needs to be amplified, which requires that the first amplifier unit 302 has a high gain to amplify the magnetic field signal of the magnetic sensor 200 as much as possible, thereby facilitating subsequent process of the magnetic field signal. Optionally, the gain of the first amplifier unit is 100.

Figure 16:
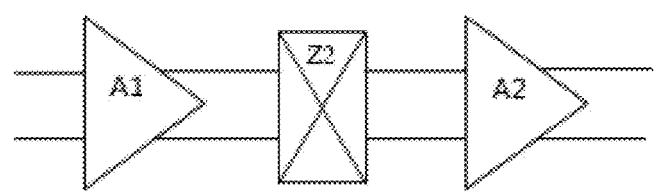
FIG. 16 is a schematic diagram of a first amplifier unit according to an embodiment of the present disclosure.

In an embodiment of the present disclosure, the first amplifier unit 302 may be a chopping-amplifier unit as shown in FIG. 16. That is, the first amplifier unit includes a first amplifier A1, a second chopping switch Z2 and a second amplifier A2 which are sequentially electrically connected. The first amplifier A1 and the second amplifier A2 can amplify input signals. The second chopping switch Z2 can demodulate the magnetic field signal of the differential signal output by the first chopping switch 301 to the low frequency region. The first amplifier A1 may be a folded-cascode amplifier and the second amplifier A2 may be a single-stage amplifier.

In reference with the integrated circuit shown in FIG. 13, the first amplifier A1 and the second amplifier A2 are configured to amplify input signals, the second chopping switch Z2 is configured to demodulate the magnetic field signal of the differential signal output by the first chopping switch 301 to the low frequency region under control of the first clock signal.

In the embodiment of the present disclosure, the first amplifier A1 receives a pair of differential signals P1 and N1 output by the first chopping switch 301, and output a pair of differential signals. The second chopping switch Z2 directly outputs the pair of differential signals output by the first amplifier A1 in a first half cycle of each clock cycle, and exchanges the two differential signals output by the first amplifier A1 and outputs the exchanged differential signals in a second half cycle of each clock cycle. The output signals of the second chopping switch Z2 are defined as P2 and N2.

As shown in FIG. 13, after the previous signal processing, the switched capacitor filter module 303 according to the embodiment of the present disclosure samples the differential signals output by the first amplifier unit 302, eliminates the offset of the sampled signal to obtain a differential signal, amplify the differential signal, and outputs the amplified differential signal, under control of the timing controller 500. Optionally, in the embodiment of the present disclosure, a sampling frequency of the switched capacitor filter module 303 may be the same as a chopping frequency of the first chopping switch, that is, frequencies of the first clock signal and the second clock signal output by the timing controller are the same. The differential signal output by the first amplifier unit 302 includes a first sub differential signal and a second sub differential signal.

In an embodiment of the present disclosure, the switched capacitor filter module may be a switched capacitor filter module as shown in FIG. 7. The switched capacitor filter module 303 includes a first switched capacitor filter SCF1, a second switched capacitor filter SCF2, a third switched capacitor filter SCF3 and a fourth switched capacitor filter SCF4. The first switched capacitor filter SCF1 and the second switched capacitor filter SCF2 sample the differential signal output by the first amplifier unit during a first half cycle thereof as a first sampled signal. The third switched capacitor filter SCF3 and the fourth switched filter SCF4 can sample the differential signal output by the first amplifier unit during a second half cycle thereof as a second sampled signal.

The first switched capacitor filter SCF1 and the second switched capacitor filter SCF2 are configured to sample the first sub differential signal and the second sub differential signal output by the first amplifier unit 302 in first half cycles thereof as a first sub sampled signal and a second sub sampled signal respectively. The third switched capacitor filter SCF3 and the fourth switch filter SCF4 can sample the first sub differential signal and the second sub differential signal output by the first amplifier unit 302 in second half cycles thereof as a third sub sampled signal and a fourth sub sampled signal respectively.

The first switched capacitor filter SCF1 and the second switched capacitor SCF2 respectively sample the differential signals P2 and N2 in first half cycles thereof as a first sub sampled signal P2A and a second sub sampled signal N2A. The third switched capacitor filter SCF3 and the fourth switched capacitor filter SCF4 respectively sample the differential signals P2 and N2 in second half cycles thereof as a third sub sampled signal P2B and a fourth sub sampled signal N2B.

Figure 17A:
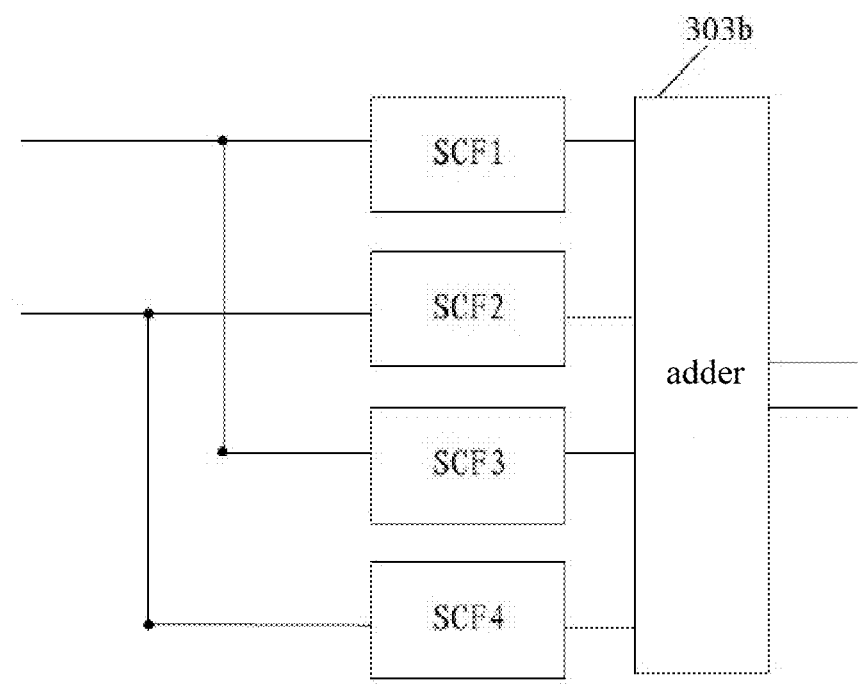
FIG. 17a is a schematic diagram of a switched capacitor filter module according to an embodiment of the present disclosure.

The offset is eliminated by adding the first sub sampled signal with the third sub sampled signal, and the offset is eliminated by adding the second sub sampled signal with the fourth sub sampled signal. As shown in FIG. 17a, the switched capacitor filter module further includes an adder 303b configured to eliminate the offset by adding the first sampled signal with the second sampled signal to obtain a differential signal and amplify the differential signal. Specifically, the adder 303b is configured to add the first sub sampled signal P2A with the third sub sampled signal P2B to eliminate the offset and add the second sub sampled signal N2A with the fourth sub sampled signal N2B to eliminate the offset, to obtain differential signals, and amplify the differential signals. Differential signals output by the adder are defined as P3 and N3. Optionally, the adder according to the embodiment of the present disclosure is a transconductance amplifier with a gain of 2.

Figure 17B:
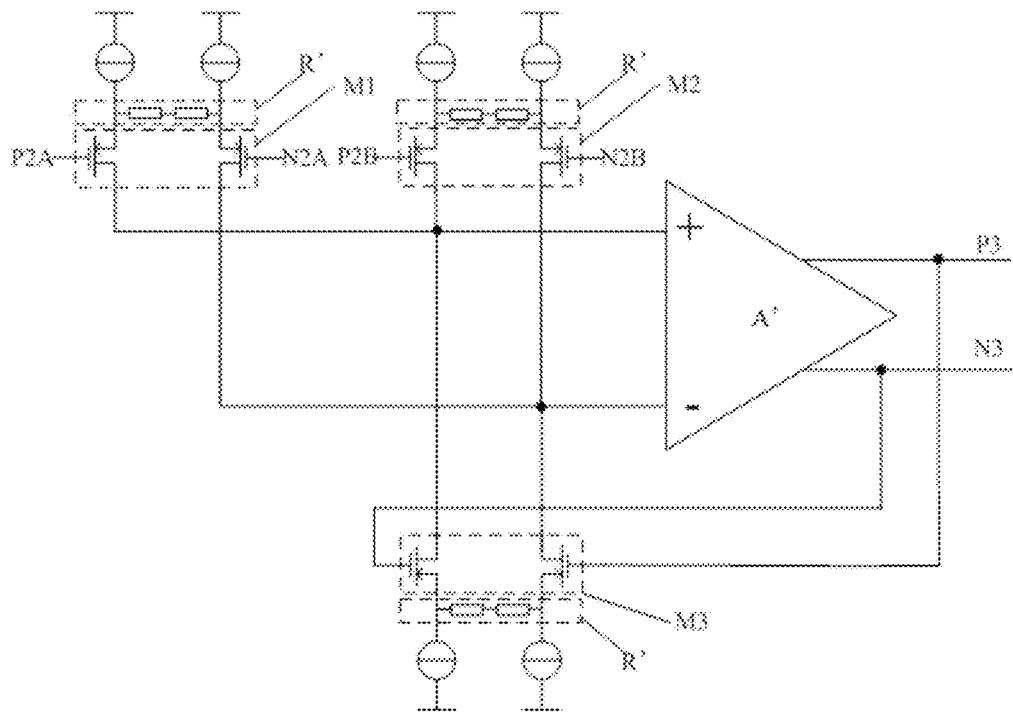
FIG. 17b is a schematic diagram of an adder according to an embodiment of the present disclosure.

As shown in FIG. 17b which is a structural diagram of an adder according to an embodiment of the present disclosure, the adder includes an operational amplifier A', a first voltage-current converter M1, a second voltage-current converter M2 and a third voltage-current converter M3. Each of the voltage-current converters is electrically connected to a current source, and includes two metal oxide semiconductor (MOS) transistors. For the first voltage-current converter M1, a gate of a MOS transistor receives the sampled signal P2A, and an output end of the MOS transistor is electrically coupled to a non-inverting end of the operational amplifier A', a gate of the other MOS transistor is configured to receive the sampled signal N2A, and an output end of the other MOS transistor is electrically coupled to an inverting end of the operational amplifier A'. For the second voltage-current converter M2, a gate of a MOS transistor of is configured to receive the sampled signal P2B and an output end of the MOS transistor is electrically connected to the non-inverting end of the operational amplifier A', a gate of the other MOS transistor can receive the sampled signal N2B and an output end of the other MOS transistor is electrically connected to the inverting end of the operational amplifier A'. For the third voltage-current converter M3, a gate of a MOS transistor can receive the differential signal N3 output by the operational amplifier A', and an output end of the MOS transistor is electrically coupled to the non-inverting end of the operational amplifier A', a gate of the other MOS transistor can receive the differential signal P3 output by the operational amplifier A', and an output end of the MOS transistor is electrically connected to the inverting end of the operational amplifier A'. The voltage-current converters of the adder convert input sampled signals into currents, and eliminate offsets by adding the currents. The currents are output after being amplified by the operational amplifier of the adder. Preferably, a source degeneration resistor is arranged at the input end of the adder to ensure that the MOS transistor of the voltage-current converter operates in a saturation region. That is, as shown in FIG. 17b, a series resistor R' is electrically connected between source electrodes of two MOS transistors of the voltage-current converter, to ensure that the MOS transistors of the voltage-current converter operate in the saturation region.

Furthermore, the signal processing unit further includes a second amplifier unit 305, which is electrically connected between the switched capacitor filter module 303 and the converter 304, and is configured to amplify the differential signal output by the adder. The second amplifier unit outputs amplified differential signals P3 and N3. In the embodiment, the second amplifier unit is a programmable gain amplifier with a gain of 5.

In the embodiment, the total amplification gain of the first amplifier unit, the adder and the second amplifier with respect to amplifying the magnetic field signal ranges from 800 to 2000 inclusively, and is preferably 1000. In other embodiments, the magnetic field signal may be amplified with a required gain by setting different gains for the first amplifier unit, the adder and the second amplifier unit.

Figure 18:
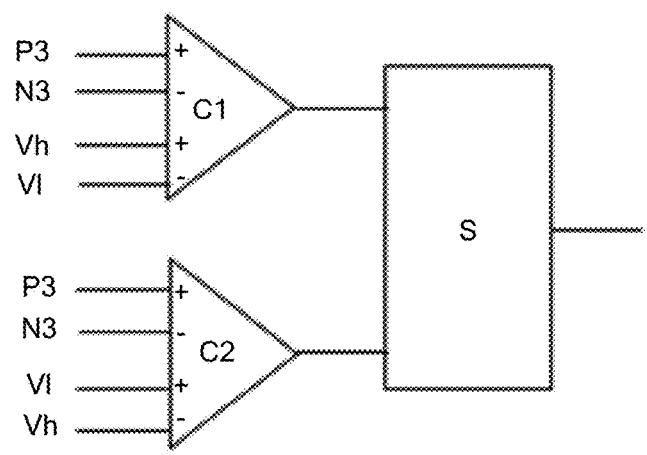
FIG. 18 is a schematic diagram of a converter according to an embodiment of the present disclosure.

As shown in FIG. 13, after processed by the switched capacitor filter module and the second amplifier unit, the differential signal needs to be converted into a magnetic field signal by the signal processing unit 300, to control the output control circuit. FIG. 18 shows a structural diagram of a converter according to an embodiment of the present disclosure. The converter includes: a first comparer C1, a second comparer C2 and a latch logical circuit S.

The first comparer C1 and the second comparer C2 are each electrically connected to a pair of differential reference voltages Vh and Vl and a pair of differential signals P3 and N3 output by the second amplifier unit. The pair of differential reference voltages of the first comparer C1 and the pair of differential reference voltages of the second comparer C2 are reversely electrically connected. The first comparer C1 is configured to compare a voltage signal output by the second amplifier unit with a high threshold Rh, and the second comparer C2 is configured to compare the voltage signal output by the second amplifier unit with a low threshold R1. Output ends of the first comparer C1 and the second comparer C2 are electrically connected to input ends of the latch logical circuit S.

Figure 19:
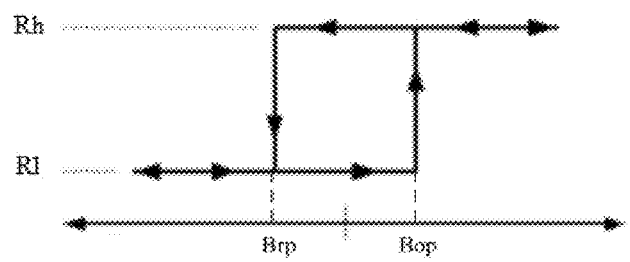
FIG. 19 is a schematic diagram of a principle for determining a polarity of a magnetic field according to an embodiment of the present disclosure.

As shown in FIG. 19, the first comparer C1 is configured to output a result of comparison between the voltage signal output by the second amplifier unit and the high threshold Rh, or a result of comparison between a strength of the external magnetic field and a predetermined operation point Bop. The second comparer C2 is configured to output a result of comparison between the voltage signal output by the second amplifier unit and the low threshold R1 or a result of comparison between the strength of the external magnetic field and a predetermined releasing point Brp.

The latch logical circuit S is configured to make the signal processing unit 300 output a signal at a first level (such as the high level) to represent a magnetic polarity of the external magnetic field, when the comparison result output by the first comparer C1 indicates that the voltage signal output by the second amplifier unit is greater than the high threshold Rh or the strength of the external magnetic field reaches the predetermined operation point Bop.

The latch logical circuit S is configured to make the signal processing unit 300 output a signal at a second level (low level) opposite to the first level to represent another kind of magnetic polarity of the external magnetic field, when the comparison result output by the second comparer C2 indicates that the voltage signal output by the second amplifier unit is lower than the low threshold R1 or the strength of the external magnetic field does not reach the predetermined releasing point Brp.

The latch logical circuit S is make the signal processing unit 300 output in an original output state, when the comparison results output by the first comparer C1 and the second comparer C2 indicate that the voltage signal output by the second amplifier unit is smaller than the higher threshold Rh and is greater than the lower threshold R1, or indicate that the strength of the external magnetic field does not reach the operation point Bop and reaches the releasing point Brp.

Figure 20:
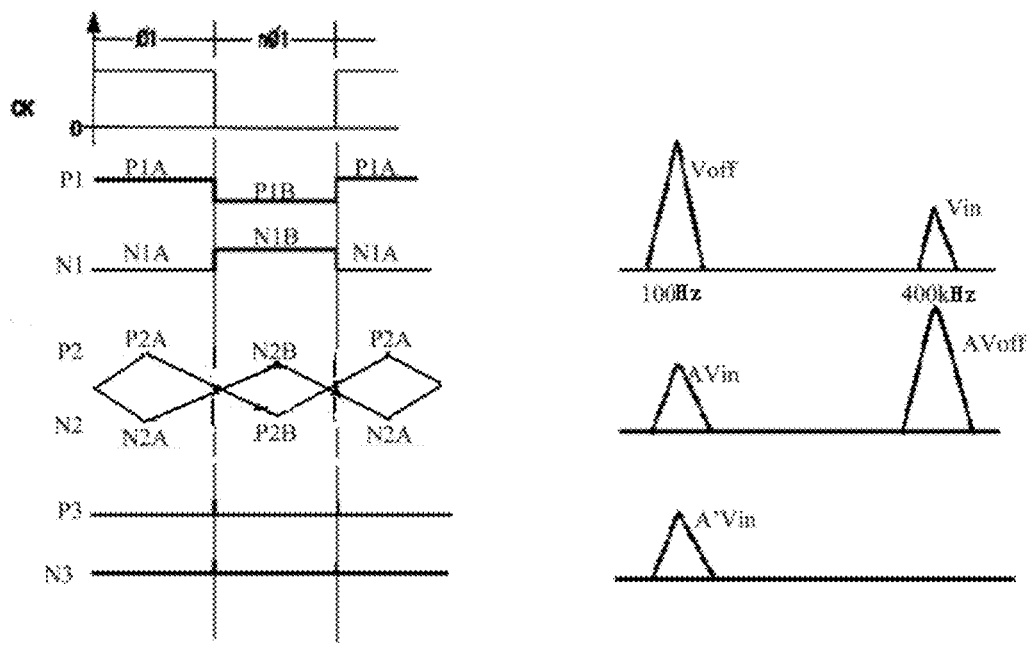
FIG. 20 is a schematic diagram of outputs of periodic clock signals according to an embodiment of the present disclosure.

The second clock signal output from the timing controller to the latch logical circuit S is delayed for a second predetermined time with respect to the third clock signal, such as 5 nanoseconds, to avoid a switching point of the switched capacitor filter. The signal process of the signal processing unit according to an embodiment of the present disclosure is described in detail in reference with FIG. 20. The left portion of FIG. 20 shows differential signals output by respective modules under control of clock signals, and the right portion of FIG. 20 show a schematic diagram of a signal corresponding to the differential signals in a frequency domain.

It can be seen from the above description that, the output signal Vout of the first chopping switch is a superposition of the offset signal Vos and the ideal magnetic field signal Vin, and equals to a difference between the differential signals P1 an N1. The differential signals P1 and N1 have the same magnitude and opposite directions. It can be seen from the above description that, for first and second half cycles of the clock signal CK1, ideal magnetic field voltage signals output by the first chopping switch have the same magnitude and opposite directions. As shown on the left portion of FIG. 20, the signal P1 is respectively represented as P1A and P1B in the first and second half cycles of clock signal, and the signal N1 is respectively represented as N1A and N1B in the first and second half cycles of clock signal. P1A, P1B, N1A and N1B are respectively represented as:

$$P1A=(Vos+Vin)/2;\ P1B=(Vos-Vin)/2$$

$$N1A=-P1A=-(Vos+Vin)/2;\ N1B=-P1B=-(Vos-Vin)/2.$$

For easy understanding, the coefficient ½ of the differential signal is omitted in descriptions hereinafter. A pair of differential signals P1' and N1' are input into the second chopping switch via the first amplifier. The signal P1' is respectively represented as P1A' and P1B' in the first and second half cycles of clock signal, and the signal N1' is respectively represented as N1A' and N1B' in the first and second half cycles of clock signal. Due to a bandwidth limitation of the first amplifier A1, the differential signals output via the first amplifier A1 are triangular wave differential signals. The following formula is only a signal form. The signals are respectively represented as:

$$P1A'=A(Voff+Vin)/2;\ P1B'=A(Voff-Vin)/2$$

$$N1A'=-P1A'=-A(Voff+Vin)/2;\ N1B'=-P1B'=-A(Voff-Vin)/2.$$

A is gain of the first amplifier, Voff is the offset of the output signal of the first amplifier which equals to a sum of an inherent offset Vos of the magnetic sensor 200 and the offset of the first amplifier. The offset Voff is variable due to the bandwidth limitation of the first amplifier Al. For easy understanding, a coefficient of the differential signal and an amplification coefficient of the amplifier are omitted in the descriptions hereinafter.

The second chopping switch Z2 is configured to directly output the pair of differential signals in a first half cycle of each clock cycle, and exchange the differential signals and output the exchanged differential signals in a second half cycle of each clock cycle. The differential signals output by the second chopping switch are represented as P2 and N2. The signal P2 is represented as P2A and P2B in first and second half cycles of clock signal, and the signal N2 is represented as N2A and N2B in first and second half cycles of clock signal. Outputs of the signals P2 and N2 are respectively represented as:

$$P2A=P1A'=(Voff+Vin);\ P2B=N1B'=-(Voff-Vin)$$

$$N2A=N1A'=-(Voff+Vin);\ N2B=P1B'=(Voff-Vin);$$

The four switched capacitor filters of the switched capacitor filter module 303 sample each signal included in the differential signals P2 and N2 in first and second half cycles of each clock cycle respectively, and output two pairs of sampled signals. That is, a pair of sampled signals acquired by the switched capacitor filter module includes P2A and P2B, and the other pair of sampled signals acquired by the switched capacitor filter module includes N2A and N2B.

The four sampled signals are input into the adder, and the adder output P3 and N3. The adder adds two pairs of respective sampled signals of the two pairs and outputs P3 and N3, where $$P3=P2A+P2B=(Voff+Vin)+(-(Voff-Vin))=2Vin;\ \text{and}$$

$$N3=N2A+N2B=-(Voff+Vin)+(Voff-Vin)=-2Vin.$$

It can be seen that, the signals P3 and N3 output by the adder only include amplified ideal magnetic field voltage signals, and the offset signals are eliminated.

In addition, the magnetic sensor integrated circuit according to the embodiment of the present disclosure further includes a counter 306 electrically connected to the converter 304. The counter can output a magnetic field detection signal (i.e. the differential signal) output by the converter 304 after counting for a predetermined time. The output of magnetic field detection signal is delayed for a predetermined time (such as 50 microseconds) by the counting of the counter 306, thereby ensuring an enough response time of the overall circuit.

Based on the above embodiments, in an embodiment of the present disclosure, the output control circuit 400 includes a first switch and a second switch. The first switch and the output port are electrically connected in a first current path, and the second switch and the output port are electrically connected in a second current path with a direction opposite to a direction of the first current path. The first switch and the second switch are selectively switched on under a control of the magnetic field detection signal. Optionally, the first switch is a diode, and the second switch is a diode or transistor, which is not limited herein, and depends on the situation.

The output control circuit 400 can control the magnetic sensor integrated circuit to operate in at least the first state or second state. In the embodiment, the first state can be a current flow from the output port 2 to the outside, and the second state can be a current flow from the outside into the output port 2. The output control circuit 400 is powered by a direct-current voltage of the second output end V2 of the full-wave rectifier bridge 110. In detail, the magnetic sensor integrated circuit may operate in the first state in which the load current flows out of the output port 2, or may operate in the second state in which the load current flows into the output port 2, or may operate in the first state and the second state alternately. Therefore, in another embodiment of the present disclosure, the output control circuit 400 may be further configured to in response to a control signal under a predetermined condition. The integrated circuit operates in at least one state of the first state in which the load current flows from the output port 2 to the outside and the second state in which the load current flows from the outside into the output port 2; and when the predetermined condition is not satisfied, the integrated circuit operates in a third state in which the operation in the first state or the second state is prevented. In a preferred embodiment, a frequency of occurrence of the third state is directly proportional to a frequency of the alternating-current power.

In the magnetic sensor integrated circuit according to the embodiments of the present disclosure, a type of the third state of the output control circuit 400 may be configured based on user requirements, as long as the output control circuit 400 is prevented from entering into the first state or the second state. For example, when the output control circuit 400 operates in the third state, the output control circuit 400 makes no response to the magnetic field sensing signal (which may be understood as that the magnetic field sensing signal can not be acquired) or the current at the output port 2 is much less than the load current (for example, less than a quarter of the load current, in this case, the current may be substantially omitted with respect to the load current).

The counter 306 can start counting in response to acquiring a predetermined triggering signal. When the counting period of time reaches the predetermined time, it is indicated that the magnetic sensor integrated circuit satisfies a predetermined condition and the magnetic sensor integrated circuit starts operation. Specifically, the predetermined triggering signal may be generated when a specified voltage in the magnetic sensor integrated circuit rises and reaches a predetermined threshold. In the embodiment, the specified voltage may be the supply voltage of the signal processing unit. In the third state, the output control circuit 400 enters into the first state or second state, after the counter 306 counts for the predetermined time such as 50 microseconds after acquiring the predetermined triggering signal.

Figure 21:
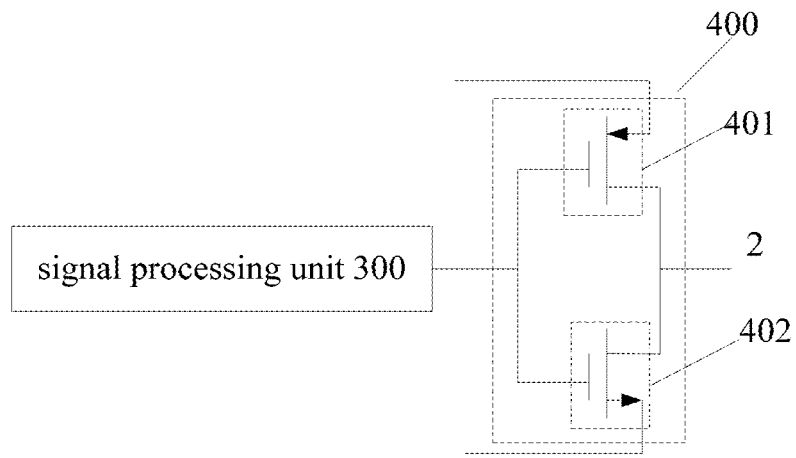
FIG. 21 is a schematic circuit diagram of an output control circuit according to an embodiment of the present disclosure.

In an embodiment of the present disclosure, as shown in FIG. 21, a first switch 401 and a second switch 402 are a pair of complementary semiconductor switches. The first switch 401 is switched on when the low level is applied thereto and the second switch 402 is switched on when the high level is applied thereto. The first switch 401 and the output port 2 are electrically connected in the first current path, and the second switch 402 and the output port 2 are electrically connected in the second current path. Control ends of the first switch 401 and the second switch 402 are both electrically connected to the signal processing unit 300. A current input end of the first switch 401 is electrically connected to a high voltage (such as a direct-current power), a current output end of the first switch 401 is electrically connected to a current input end of the second switch 402, and a current output end of the second switch 402 is electrically connected to a low voltage (such as a grounded end). If the magnetic field detection signal output by the signal processing unit 300 is low level, the first switch 401 is switched on while the second switch 402 is switched off, and a load current flows out from a high voltage via the first switch 401 and the output port 2. If the magnetic field detection signal output by the signal processing unit 300 is high level, the second switch 402 is switched on while the first switch 401 is switched off, and the load current flows from outside into the output port 2 and flows through the second switch 402. In an example shown in FIG. 21, the first switch 401 is a positive channel metal oxide semiconductor field effect transistor (P-type MOSFET), and the second switch 402 is a negative channel metal oxide semiconductor field effect transistor (N-type MOSFET). It can be understood that, in other embodiments, the first and second switches may be semiconductor switches of other types, for example, may be other field effect transistors such as a junction field effect transistor (JFET) and a metal semiconductor field effect transistor (MESFET).

Figure 22:
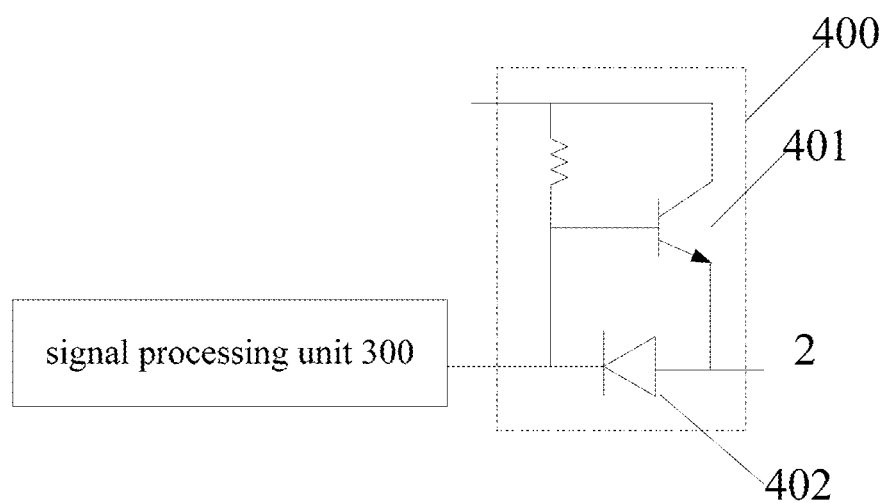
FIG. 22 is a schematic circuit diagram of an output control circuit according to another embodiment of the present disclosure.

In another embodiment of the present disclosure, as shown in FIG. 22, the first switch 401 is switched on when the high level is applied thereto, the second switch 402 is an unidirectional conducting diode. And a control end of the first switch 401 and a cathode of the second switch 402 are electrically connected to an output end of the converter of the signal processing unit 300. A current input end of the first switch 401 is electrically connected to an output end of the rectifier circuit, and a current output end of the first switch 401 is electrically connected to an anode of the second switch 401 and an output port 2. The first switch 401 and the output port 2 are electrically connected in the first current path, and the output port 2, the second switch 402 and the signal processing unit 300 are electrically connected in the second current path. If the magnetic field detection signal output by the signal processing unit 300 is high level, the first switch 401 is switched on while the second switch 402 is switched off, and a load current flows from the rectifier circuit to the outside via the first switch 401 and the output port 2. If the magnetic field detection signal output by the signal processing unit 300 is low level, the second switch 402 is switched on while the first switch 401 is switched off, and a load current flows from outside into the output port 2 and flows through the second switch 402. It can be understood that, in other embodiments of the present disclosure, the first switch 401 and the second switch 402 may have other structures, which is not limited herein, and depends on the situation.

In another embodiment of the present disclosure, the output control circuit includes a first current path in which a current flows from the output port to the outside, a second current path in which a current flows from the output port to the inside, and a switch electrically connected to one of the first current path and the second current path. The switch is controlled by magnetic field detection signal output by the signal processing unit, to switch on the first current path and the second current path selectively. Optionally, no switch is arranged in the other path of the first current path and the second current path.

Figure 23A:
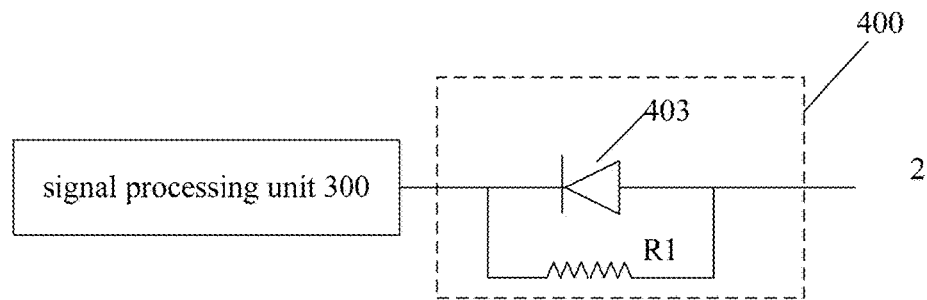
FIG. 23a is a schematic circuit diagram of an output control circuit according to yet another embodiment of the present disclosure.

As an implementation, as shown in FIG. 23a, the output control circuit 400 includes a unidirectional conducting switch 403 electrically connected to the output port 2 in the first current path. A current input end of the unidirectional conducting switch 403 may be electrically connected to an output end of the signal processing unit 300. The output end of the signal processing unit 300 may be electrically connected to the output port 2 via a resistor R1 in the second current path, a direction of which is opposite to a direction of the first current path. The unidirectional conducting switch 403 is switched on when the magnetic field sensing signal is at the high level, and a load current flows to the outside via the unidirectional conducting switch 403 and the output port 2. The unidirectional conducting switch 403 is switched off when the magnetic field sensing signal is at the low level, and a load current flows from the outside into the output port 2 and flows through the resistor R1 and the signal processing unit 300. Alternatively, the resistor R1 in the second current path may be replaced with a unidirectional conducting switch electrically connected to the unidirectional conducting switch 403 in parallel back to back, such that the load current flowing out of the output port is balanced with the load current flowing into the output port.

Figure 23B:
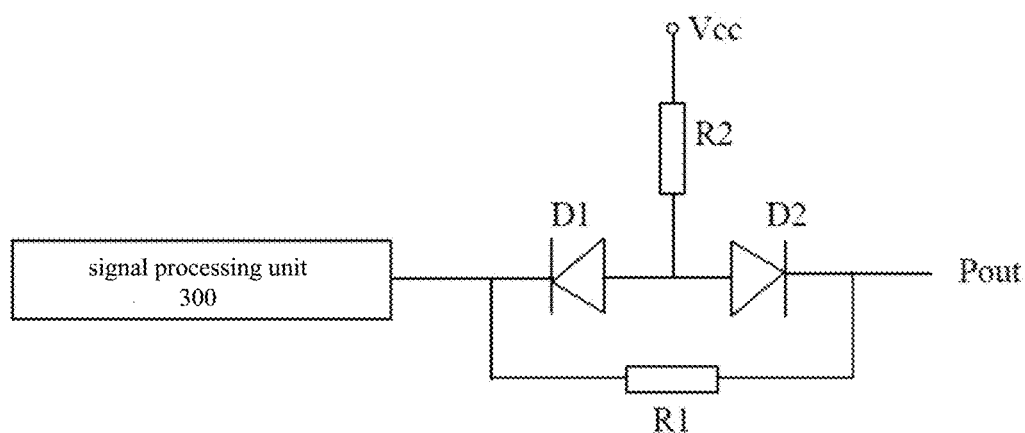
FIG. 23b is schematic diagram of an output control circuit according to yet another embodiment of the present disclosure.

In another implementation, as shown in FIG. 23b, the output control circuit 400 includes diodes D1 and D2, a resistor R1 and a resistor R2. The diodes D1 and D2 are reversely electrically connected in series between the output end of the signal processing unit 300 and the output port 2. The resistor R1 is electrically connected to the series-electrically connected diodes D1 and D2 in parallel. The resistor R2 is electrically connected between a power Vcc and a common end of the diodes D1 and D2. A cathode of the diode D1 is electrically connected to the output end of the signal processing unit 300. The diode D1 is controlled by the magnetic field detection information. When the magnetic detection signal is high level, the diode D1 is switched off and a load current flows from an output port Pout to the outside via the resistor R2 and the diode D2. When the magnetic field detection signal is low level, a load current flows from the outside into the output port Pout and flows through the resistor R1 and the signal processing unit 300.

The magnetic field integrated circuit according to the embodiments of the present disclosure is described in conjunction with a specific application as follows.

Figure 24:
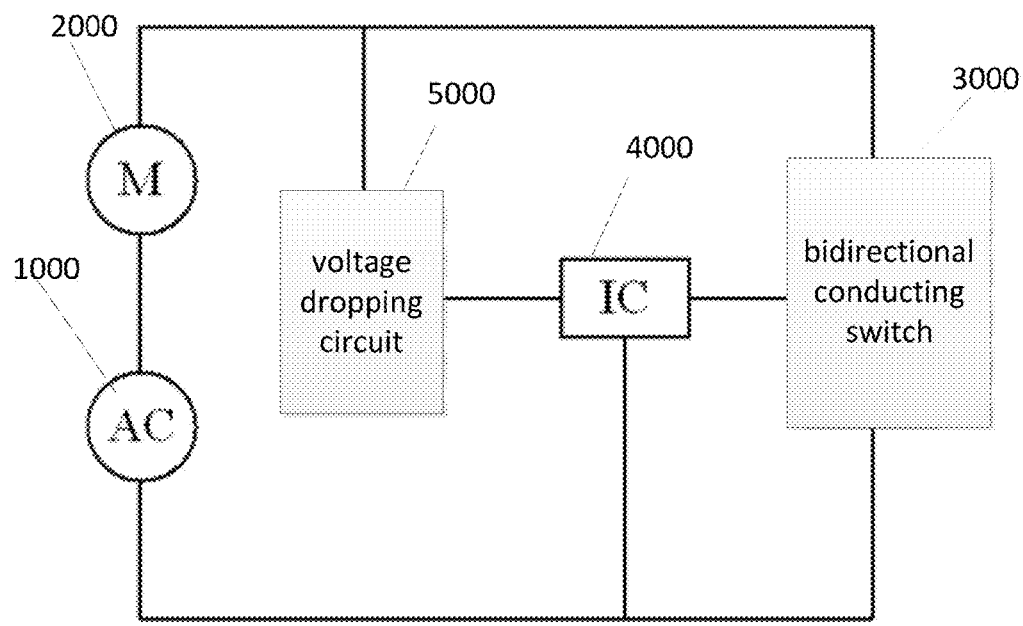
FIG. 24 is a schematic structural diagram of a circuit of a motor assembly according to an embodiment of the present disclosure.

As shown in FIG. 24, an electric motor assembly is further provided according to an embodiment of the present disclosure. The electric motor assembly includes an electric motor 2000 powered by an alternating-current power 1000, a bidirectional conducting switch 3000 electrically connected to the electric motor 2000 in series, and a magnetic sensor integrated circuit 4000 according to any one of the above embodiments of the present disclosure. An output port of the magnetic sensor integrated circuit 4000 is electrically connected to a control end of the bidirectional conducting switch 3000. Preferably, the bidirectional conducting switch 3000 may be a triode alternating current switch (TRIAC). It can be understood that, the bidirectional conducting switch may be implemented with other suitable types of switches. For example, the bidirectional conducting switch may include two silicon controlled rectifiers electrically connected in reverse parallel and a corresponding control circuit. The two silicon controlled rectifiers are controlled by the control circuit in a predetermined manner based on an output signal output by the output port of the magnetic sensor integrated circuit. Preferably, the electric motor further includes a voltage-dropping circuit 5000 to drop the voltage of the alternating-current power 1000 and provide the dropped voltage to the magnetic sensor integrated circuit 4000. The magnetic sensor integrated circuit 4000 is arranged in proximity to a rotor of the electric motor 2000 to sense a change of a magnetic field of the rotor.

Figure 25:
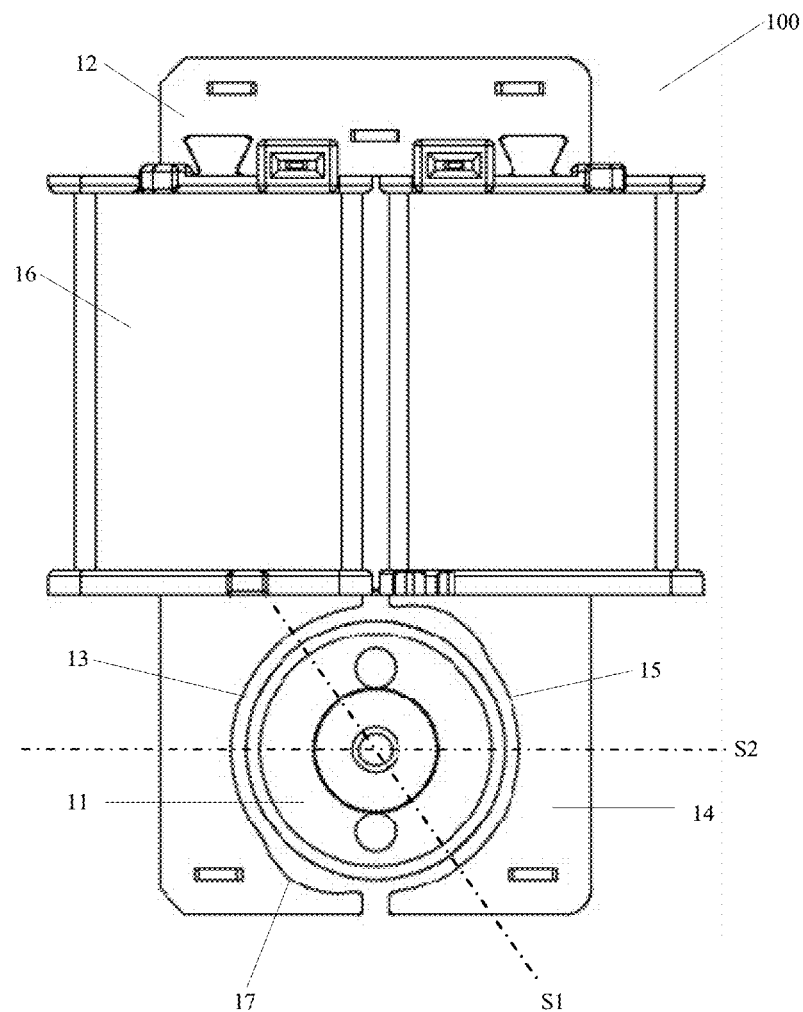
FIG. 25 is a schematic structural diagram of a synchronous motor according to an embodiment of the present disclosure.

Based on the above embodiment, in an embodiment of the present disclosure, the electric motor is a synchronous electric motor. It can be understood that, the magnetic sensor integrated circuit according to the present disclosure is not only applied in the synchronous electric motor, but also applied in other types of permanent magnet electric motor such as direct-current brushless motor. As shown in FIG. 25, the synchronous motor includes a stator and a rotor 1001 rotating with respect to the stator. The stator includes a stator core 1002 and a stator winding 1006 wound around the stator core 1002. The stator core 1002 may be made of soft magnetic material such as pure iron, cast iron, cast steel, electrical steel and silicon steel. The rotor 1001 includes a permanent magnet. When the stator winding 1006 is electrically connected to the alternating current power in series, the rotor 1001 rotates with a constant speed of a constant rotation rate of (60 f/p) circle/minute in a steady state, where f is a frequency of the alternating-current power, and p is a number of pole-pairs of the rotor. In the embodiment, the stator core 1002 has two pole portions 1004 arranged oppositely. Each of the pole portions has a polar arc surface 1005. An external surface of the rotor 1001 faces the polar arc surface 1005, and a substantially uniform air gap is formed therebetween. The basically uniform air gap in the present disclosure indicates that majority of the air gap between the stator and the rotor is uniform, and minority of the air gap between the stator and the rotor is non-uniform. Preferably, a concave starting groove 1007 is arranged on the polar arc surface 1005 of the pole portion of the stator. Portions other than the starting groove 1007 on the polar arc surface 1005 are concentric with the rotor. With the above configurations, a non-uniform magnetic field may be formed which ensures that when the rotor does not rotate, a polar axis Si of the rotor is tilted with an angle with respect to a central axis S2 of the pole portion of the stator, so that the rotor can have a starting torque each time when the electric motor is powered on under an effect of the integration circuit. The polar axis Si of the rotor is a boundary between two magnetic poles of the rotor with different polarities. The central axis S2 of the pole portion 1004 of the stator is a connection line passing through centers of the two pole portions 1004 of the stator. In the embodiment, the stator and the rotor each have two magnetic poles. It can be understood that, in other embodiments, the number of magnetic poles of the stator may be different from the number of magnetic poles of the rotor, and the stator and the rotor may have more magnetic poles such as four magnetic poles and six magnetic poles.

Preferably, the output control circuit 400 is configured to switch on the bidirectional conducting switch 3000, when the alternating-current power 1000 operates in a positive half cycle and the magnetic sensor detects that a magnetic field of the permanent magnet rotor has a first polarity, or when the alternating-current power 1000 operates in a negative half cycle and the magnetic sensor detects that the magnetic field of the permanent magnet rotor has a second polarity opposite to the first polarity. The output control circuit 400 switches off the bidirectional conducting switch 3000, when the alternating-current power 1000 operates in the negative half cycle and the permanent magnet rotor has the first polarity, or when the alternating-current power 1000 operates in the positive half cycle and the permanent magnet rotor has the second polarity.

Based on the above embodiment, in an embodiment of the present disclosure, the output control circuit 400 is configured to control a drive current to flow between the output port and the bidirectional conducting switch 3000, thereby switching on the bidirectional conducting switch 300, when the alternating-current power 1000 operates in the positive half cycle and the magnetic sensor 200 detects that the magnetic field of the permanent magnet rotor with the first polarity, or when the alternating-current power 1000 operates in the negative half cycle and the magnetic sensor (which includes a magnetic sensor and a signal processing unit electrically connected thereto) detects that the magnetic field of the permanent magnet rotor with the second polarity opposite to the first polarity; and to prevent a driven current flows between the output port and the bidirectional conducing switch 3000, when the alternating-current power 1000 operates in the negative half cycle and the permanent magnet rotor has the first polarity, or when the alternating-current power 1000 operates in the positive half cycle and the permanent magnet rotor has the second polarity.

Preferably, the output control circuit 400 is configured to control a current to flow from the integrated circuit to the bidirectional conducting switch 3000, when the signal output by the alternating-current power 1000 is in the positive half cycle and the magnetic sensor detects that the magnetic field of the permanent magnet rotor with the first polarity; and control a current to flow from the bidirectional conducting switch 3000 to the integrated circuit, when the signal output by the alternating-current power 1000 is in the negative half cycle and the magnetic sensor detects that the magnetic field of the permanent magnet rotor with the second polarity opposite to the first polarity. It can be understood that, when the permanent magnet rotor has the first magnetic polarity and the alternating-current power is in the positive half cycle, the current may flow out of the integrated circuit for the entire or a portion of the positive half cycle; and when the permanent magnet rotor with the second magnetic polarity and the alternating-current power is in the negative half cycle, the current may be flowing into of the integrated circuit for the entire or a portion of the negative half cycle s.

In a preferred embodiment of the present disclosure, the rectifier circuit 100 has a circuit as shown in FIG. 12, the output control circuit 400 has a circuit as shown in FIG. 21. The current input end of the first switch 401 of the output control circuit 400 is electrically connected to the second output end V2 of the full-wave rectifier bridge 110, and the current output end of the second switch 402 is electrically connected to a grounded end of the full-wave rectifier bridge 110. When a signal output by the alternating-current power 1000 is in a positive half cycle and the magnetic sensor outputs a low level signal, the first switch 401 is switched on and the second switch 402 is switched off in the output control circuit 400, and a current sequentially flows through the alternating-current power 1000, the electric motor 2000, a first input end of the magnetic sensor integrated circuit 4000, a voltage-dropping circuit (not shown in the drawings), the second diode 112 of the full-wave rectifier bridge 110 and the first switch 401 of the output control circuit 400, and flows from the output port to the bidirectional conducting switch 3000 and then returns to the alternating-current power 1000. When the bidirectional conducting switch 3000 is switched on, a series branch formed by the voltage-decreasing circuit 5000 and the magnetic sensor integrated circuit 4000 is short-circuited, the magnetic sensor integrated circuit 4000 stops outputting due to absence of supply voltage, and the bidirectional conducting switch 3000 remains being switched on while no driven current flows between a control pole and a first anode of the bidirectional conducting switch 3000, since a current flowing through two anodes of the bidirectional conducting switch 3000 is large enough (larger than a holding current of the bidirectional conducting switch 3000). When the signal output by the alternating-current power 1000 operates in a negative half cycle and a magnetic field detection signal output by the magnetic sensor is high level, the first switch 401 is switched off while the second switch 402 is switched on in the output control circuit 400, and a current flows from the alternating-current power 1000, flows into the output port via the bidirectional conducting switch 3000, and return to the alternating-current power 1000 via the second switch 402 of the output control circuit 400, the first diode 111 of the full-wave rectifier bridge 110, the first input end of the magnetic sensor integrated circuit 4000 and the electric motor 2000. Similarly, when the bidirectional conducting switch 3000 is switched on, the magnetic sensor integrated circuit 4000 is short-circuited and thus stops outputting, and the bidirectional conducting switch 3000 may remain being switched on. When the signal output by the alternating-current power 1000 operates in the positive half cycle and the magnetic field detection signal output by the magnetic sensor is high level, or when the signal output by the alternating-current power 1000 operates in the negative half cycle and the magnetic detection signal output by the magnetic sensor is low level, the first switch 401 and the second switch 402 of the output control circuit 400 are switched off and the bidirectional conducting switch 3000 is switched off. Therefore, the output control circuit 400 can control, based on a polarity change and a differential signal of the alternating-current power 1000, the integrated circuit to switch the bidirectional conducting switch 3000 on and off in a predetermined manner. In this way, the way of powering the stator winding 1006 is controlled, and a changing magnetic field generated by the stator matches with a magnetic field position of the rotor, thereby dragging the rotor to rotate along a signal direction, which ensures that the rotor rotates in a fixed direction each time when the electric motor is powered on.

In the embodiment of the present disclosure, the magnetic field detection signal is a switch-type detection signal. In a steady stage of the electric motor, a switching frequency of the switch-type detection signal is twice the frequency of the alternating-current power.

It can be understood that, in the above embodiments, the magnetic sensor integrated circuit according to the present disclosure is described only in conjunction with a possible application, and the magnetic sensor according to the present disclosure is not limited thereto. For example, the magnetic sensor is not only applied in an electric motor driving, but can also be applied in other applications with magnetic field detection.

In a motor according to another embodiment of the present disclosure, the motor may be electrically connected to a bidirectional conducting switch in series between two ends of an external alternating-current power. A first series branch formed by the electric motor and the bidirectional conducting switch is parallel-electrically connected to a second series branch formed by a voltage-decreasing circuit and a magnetic sensor integrated circuit. An output port of the magnetic sensor integrated circuit is electrically connected to the bidirectional conducting switch, to control the bidirectional conducting switch to switch on and switch off in a predetermined manner, thereby controlling a way of powering the stator winding.

Accordingly, an application apparatus is further provided according to an embodiment of the present disclosure. The application apparatus includes a motor powered by an alternating-current power, a bidirectional conducting switch electrically connected to the electric motor in series, and the magnetic sensor integrated circuit according to any one of the above embodiments. An output port of the magnetic sensor integrated circuit is electrically connected to a control end of the bidirectional conducting switch. Optionally, the application apparatus may be a pump, a fan, a household appliance, a vehicle and the like, where the household appliance, for example, may be a washing machine, a dishwasher, a range hood, an exhaust fan and the like.

With the above descriptions of the disclosed embodiments, those skilled in the art may achieve or use the present disclosure. Various modifications to the embodiments are apparent for those skilled in the art. The general principle defined herein may be implemented in other embodiments without departing from the spirit or scope of the disclosure. Therefore, the present disclosure is not limited to the embodiments disclosed herein, but confirm to the widest scope in consistent with the principle and the novel features disclosed herein.

The invention claimed is:

1. A magnetic sensor integrated circuit, comprising:
a magnetic sensor receiving a constant current outputting a differential signal;
a signal processing unit converting the differential signal into a magnetic field detection signal; and
an output control circuit controlling, at least based on the magnetic field detection signal, the magnetic sensor integrated circuit to operate in at least one state of a first state in which a current flows from an output port of the magnetic sensor integrated circuit to an outside of the magnetic sensor integrated circuit and a second state in which a current flows from the outside into the output port; and
wherein the differential signal comprises a magnetic field signal and an offset signal, the signal processing unit comprises a first chopping switch to modulate the magnetic field signal and the offset signal to a high-frequency region and a baseband frequency respectively.

2. The magnetic sensor integrated circuit according to claim 1, further comprising a rectifier circuit to covert an external power into a direct-current power, and wherein the rectifier circuit comprises a full-wave rectifier bridge and a voltage-stabilizing unit, wherein the full-wave rectifier bridge converts an external alternating-current power into a direct-current voltage to power the output control circuit, and the voltage-stabilizing unit converts the direct-current voltage output by the full-wave rectifier bridge into a low-voltage direct current to power the signal processing unit.

3. The magnetic sensor integrated circuit according to claim 1, wherein the signal processing unit converts the differential signal into the magnetic field detection signal by amplifying the differential and eliminating an offset of the differential signal, and the constant current is not affected by temperature change.

4. The magnetic sensor integrated circuit according to claim 1, wherein the signal processing unit further comprises a first amplifier unit to amplify a differential signal output by the first chopping switch and demodulate the magnetic field signal of the differential signal output by the first chopping switch to the baseband frequency region and output the demodulated differential signal.

5. The magnetic sensor integrated circuit according to claim 4, wherein the signal processing unit further comprises a switched capacitor filter module to sample the differential signal output by the first amplifier unit, eliminate an offset of the sampled signal, amplify the sampled signal and output the amplified sampled signal.

6. The magnetic sensor integrated circuit according to claim 5, wherein the signal processing unit further comprises a converter to convert the differential signal output by the switched capacitor filter module into the magnetic field detection signal and output the magnetic field detection signal to the output control circuit.

7. The magnetic sensor integrated circuit according to claim 6, further comprising a timing controller configured to output a first clock signal to the first chopping switch and the first amplifier unit, output a second clock signal to the switched capacitor filter module, and output a third clock signal to the converter, wherein the second clock signal is delayed for a first predetermined time with respect to the first clock signal, and the second clock signal is delayed for a second predetermined time with respect to the third clock signal.

8. The magnetic sensor integrated circuit according to claim 4, wherein the first amplifier unit comprises a first amplifier, a second chopping switch and a second amplifier; and
the first amplifier and the second amplifier amplify an input signal, and the second chopping switch demodulates the magnetic field signal of the differential signal output by the first chopping switch to the low frequency region.

9. The magnetic sensor integrated circuit according to claim 5, wherein the switched capacitor filter module comprises: a first switched capacitor filter, a second switched capacitor filter, a third switch capacitor filter and a fourth switched capacitor filter; and
the first switched capacitor filter and the second switched capacitor filter sample the differential signal output by the first amplifier unit in a first half cycle as a first sampled signal, and the third switched capacitor filter and the fourth switched capacitor filter sample the differential signal output by the first amplifier unit in a second half cycle as a second sampled signal.

10. The magnetic sensor integrated signal according to claim 9, wherein the switched capacitor filter module further comprises an adder to perform an offset-elimination and amplification by adding the first sampled signal with the second sampled signal.

11. The magnetic sensor integrated circuit according to claim 10, wherein the signal processing unit further comprises a second amplifier unit configured to amplify a differential signal output by the adder.

12. The magnetic sensor integrated circuit according to claim 11, wherein amplification gains of the first amplifier unit, the adder and the second amplifier unit range from 800 to 2000 inclusively.

13. The magnetic sensor integrated circuit according to claim 11, wherein the converter comprises a first comparer, a second comparer and a latch logic circuit, the first comparer is electrically coupled to a pair of differential reference voltages and a pair of deferential signals output by the second amplifier unit, and the second comparer is electrically coupled to a pair of differential reference voltages and a pair of deferential signals output by the second amplifier unit, wherein the pair of differential reference voltages electrically connected to the first comparer are reversely with the pair of differential reference voltages electrically connected to the second comparer; and the first comparer is configured to output a comparison result between a voltage signal output by the second amplifier unit and a high threshold or a comparison result between a magnetic field strength and a predetermined operation point, the second comparer is configured to output a comparison result between the voltage signal output by the second amplifier unit and a low threshold or a comparison result between the magnetic field strength and a predetermined releasing point; and the latch logic circuit is configured to make the converter output a first level when the comparison result output by the first comparer indicates that the voltage signal output by the second amplifier unit is higher than the high threshold or the magnetic field strength reaches the predetermined operation point, and make the converter output a second level reverse to the first level when the comparison result output by the second comparer indicates that the voltage signal output by the second amplifier unit is lower than the low threshold or the magnetic field strength does not reach the predetermined releasing point, and make the converter remain in an original output state when the comparison results output by the first comparer and the second comparer indicate that the voltage signal output by the second amplifier unit is lower than the high threshold and greater than the low threshold or indicate that the magnetic field strength does not reach the operation point and reaches the releasing point.

14. The magnetic sensor integrated circuit according to claim 1, wherein the output control circuit comprises a first switch and a second switch, the first switch and the output port are electrically coupled in a first current path, the second switch and the output port are electrically coupled in a second current path with a direction opposite to a direction of the first current path, and the first switch and the second switch are switched on selectively under control of the magnetic field detection signal.

15. The magnetic sensor integrated circuit according to claim 14, wherein the output control circuit comprises a switch electrically connected between a signal processing unit and the output port, the switch is controlled by the magnetic field detection signal; and a current flows from the output port to the outside or flows from the outside to the output port.

16. The magnetic sensor integrated circuit according to claim 2, wherein a switching frequency of the magnetic field detection signal is proportional to a frequency of the alternating-current power or is two times the frequency of the alternating-current power.

17. A motor assembly, comprising a motor and the magnetic sensor integrated circuit according to claim 1.

18. An application apparatus comprising a motor assembly, wherein the motor assembly comprises a motor powered by an alternating-current power and the magnetic sensor integrated circuit according to claim 1.

19. The application apparatus according to claim 18, comprising a pump, a fan, a household appliance or a vehicle.

* * * * *